US010339042B2

(12) United States Patent
Oh et al.

(10) Patent No.: US 10,339,042 B2
(45) Date of Patent: Jul. 2, 2019

(54) MEMORY DEVICE INCLUDING COLUMN REDUNDANCY

(71) Applicant: SAMSUNG ELECTRONICS CO., LTD., Suwon-si, Gyeonggi-do (KR)

(72) Inventors: Yoonna Oh, Seongnam-si (KR); Deok-Gu Yoon, Seoul (KR); Sanguhn Cha, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 112 days.

(21) Appl. No.: 15/695,060

(22) Filed: Sep. 5, 2017

(65) Prior Publication Data
US 2018/0067847 A1  Mar. 8, 2018

Related U.S. Application Data

(60) Provisional application No. 62/383,738, filed on Sep. 6, 2016.

(30) Foreign Application Priority Data

Mar. 27, 2017  (KR) .......................... 10-2017-0038649

(51) Int. Cl.
*G06F 12/02* (2006.01)
*G06F 3/06* (2006.01)
(Continued)

(52) U.S. Cl.
CPC ........ *G06F 12/0207* (2013.01); *G06F 3/0679* (2013.01); *G06F 11/1048* (2013.01);
(Continued)

(58) Field of Classification Search
CPC ............... G06F 12/0207; G06F 3/0679; G06F 11/1048; G11C 8/12; G11C 29/42; G11C 29/76
See application file for complete search history.

(56) References Cited

U.S. PATENT DOCUMENTS 6,490,208 B2   12/2002  Yoon
6,915,476 B2   7/2005   Morino et al.
(Continued)

FOREIGN PATENT DOCUMENTS

KR  20020002133 A   1/2002
KR  20130132048 A   12/2013
(Continued)

*Primary Examiner* — Tri M Hoang
(74) *Attorney, Agent, or Firm* — Volentine, Whitt & Francos, PLLC

(57) ABSTRACT

A memory device includes a memory cell array and a column decoder. The memory cell array includes a plurality of mats connected to a word line. The column decoder includes a first repair circuit in which a first repair column address is stored, and a second repair circuit in which a second repair column address is stored. When the first repair column address coincides with a column address received in a read command or a write command, the column decoder selects other bit lines instead of bit lines corresponding to the received column address in one mat from among the plurality of mats. When the second repair column address coincides with the received column address, the column decoder selects other bit lines instead of the bit lines corresponding to the received column address in the plurality of mats.

20 Claims, 13 Drawing Sheets

(51) Int. Cl.
*G11C 8/12* (2006.01)
*G11C 29/42* (2006.01)
*G11C 29/00* (2006.01)
*G06F 11/10* (2006.01)
*G11C 7/12* (2006.01)
*G11C 29/12* (2006.01)
*G11C 29/44* (2006.01)

(52) U.S. Cl.
CPC ............... *G11C 8/12* (2013.01); *G11C 29/42* (2013.01); *G11C 29/76* (2013.01); *G11C 7/12* (2013.01); *G11C 2029/1204* (2013.01); *G11C 2029/4402* (2013.01)

(56) References Cited

U.S. PATENT DOCUMENTS

| | | | | |
|---|---|---|---|---|
| 7,218,558 | B2* | 5/2007 | Kang | G11C 29/806 365/189.02 |
| 8,885,433 | B2* | 11/2014 | Kim | G11C 29/027 365/189.05 |
| 8,995,212 | B2 | 3/2015 | Park | |
| 8,996,956 | B2 | 3/2015 | Yang et al. | |
| 9,190,176 | B2* | 11/2015 | Kim | G11C 29/808 |
| 9,230,687 | B2 | 1/2016 | Cordero et al. | |
| 9,324,460 | B1* | 4/2016 | You | G11C 29/781 |
| 9,378,089 | B2 | 6/2016 | Nakagawa | |
| 9,384,859 | B2* | 7/2016 | Yun | G11C 29/781 |
| 9,424,953 | B2 | 8/2016 | Hirano | |
| 2014/0317469 | A1 | 10/2014 | Sohn et al. | |
| 2016/0224412 | A1 | 8/2016 | Healy et al. | |
| 2016/0240270 | A1 | 8/2016 | Alrod et al. | |

FOREIGN PATENT DOCUMENTS

| | | |
|---|---|---|
| KR | 20140003100 A | 1/2014 |
| KR | 20140125981 A | 10/2014 |

* cited by examiner

MEMORY DEVICE INCLUDING COLUMN REDUNDANCY

CROSS-REFERENCE TO RELATED APPLICATIONS

A claim for priority under 35 U.S.C. § 119 is made to U.S. Provisional Patent Application No. 62/383,738 filed Sep. 6, 2016, in the U.S. Patent and Trademark Office, and is made to Korean Patent Application No. 10-2017-0038649 filed Mar. 27, 2017, in the Korean Intellectual Property Office, the entire contents of which are hereby incorporated by reference.

BACKGROUND

The inventive concepts described herein relate to memory devices, and more particularly to memory devices having column redundancy.

Memory devices are widely used in electronic devices such as mobile devices and computers for example. The memory capacity of memory devices has recently increased due to advancements in manufacturing process technologies. However, as a consequence of recent advancements of miniaturization process technology, the number of defective memory cells in memory devices has increased, resulting in decreased memory device yield.

In an effort to increase yield, spare memory cells have been incorporated into memory devices. However, as defects may occur in spare memory cells, the yield of spare memory cells has also decreased, consequently decreasing yield of memory devices.

SUMMARY

Embodiments of the inventive concept provide a memory device including column redundancy.

Embodiments of the inventive concept provide a memory device including a memory cell array and a column decoder. The memory cell array includes a plurality of mats connected to a word line and a plurality of bit lines. The column decoder includes a first repair circuit in which a first repair column address is stored, and a second repair circuit in which a second repair column address is stored. When the first repair column address coincides with a received column address in a read command or a write command, the column decoder is configured to select other bit lines from among the plurality of bit lines instead of bit lines from among the plurality of bit lines corresponding to the received column address in one mat among the plurality of mats. Also, when the second repair column address coincides with the received column address, the column decoder is configured to select other bit lines from among the plurality of bit lines instead of the bit lines corresponding to the received column address in the plurality of mats.

Embodiments of the inventive concept further provide a memory device including a memory cell array and a column decoder. The memory cell array includes a first plurality of mats connected with a first word line, and a second plurality of mats connected with a second word line. The first and second plurality of mats are connected to a plurality of bit lines. A plurality of memory cells connected to the first word line and the second word line are selected by a single activation command. The column decoder includes a first repair circuit in which a first repair column address is stored, and a second repair circuit in which a second repair column address is stored. When the first repair column address coincides with a received column address in a read command or a write command, the column decoder is configured to select first bit lines from among the plurality of bit lines different from bit lines from among the plurality of bit lines corresponding to the received column address in the first plurality of mats. Also, when the second repair column address coincides with the received column address, the column decoder is configured to select second bit lines from among the plurality of bit lines different from the bit lines corresponding to the received column address in the second plurality of mats.

Embodiments of the inventive concept still further provide a memory device including a plurality of memory cell arrays and a plurality of column decoders. The memory cell arrays include a plurality of mats connected to one word line, and a plurality of bit lines connected to the plurality of mats. The plurality of column decoders are respectively connected with the plurality of memory cell arrays, each of the plurality of column decoders include a first repair circuit in which a first repair column address is stored and a second repair circuit in which a second repair column address is stored. At least two memory cell arrays among the plurality of memory cell arrays are selected based on a single activation command When a received column address in a read command or a write command and the first repair column address coincide with each other, each of at least two column decoders from the plurality of column decoders connected with the selected at least two memory cell arrays selects first bit lines from among the plurality of bit lines instead of bit lines from among the plurality of bit lines corresponding to the received column address in one mat among the plurality of mats. When the received column address and the second repair column address coincide with each other, each of the at least two column decoders connected with the selected at least two memory cell arrays selects second bit lines from among the plurality of bit lines instead of the bit lines corresponding to the received column address in the plurality of mats.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Below, embodiments of the inventive concept are described in detail and clearly to such an extent that one of ordinary skill in the art may easily implement the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
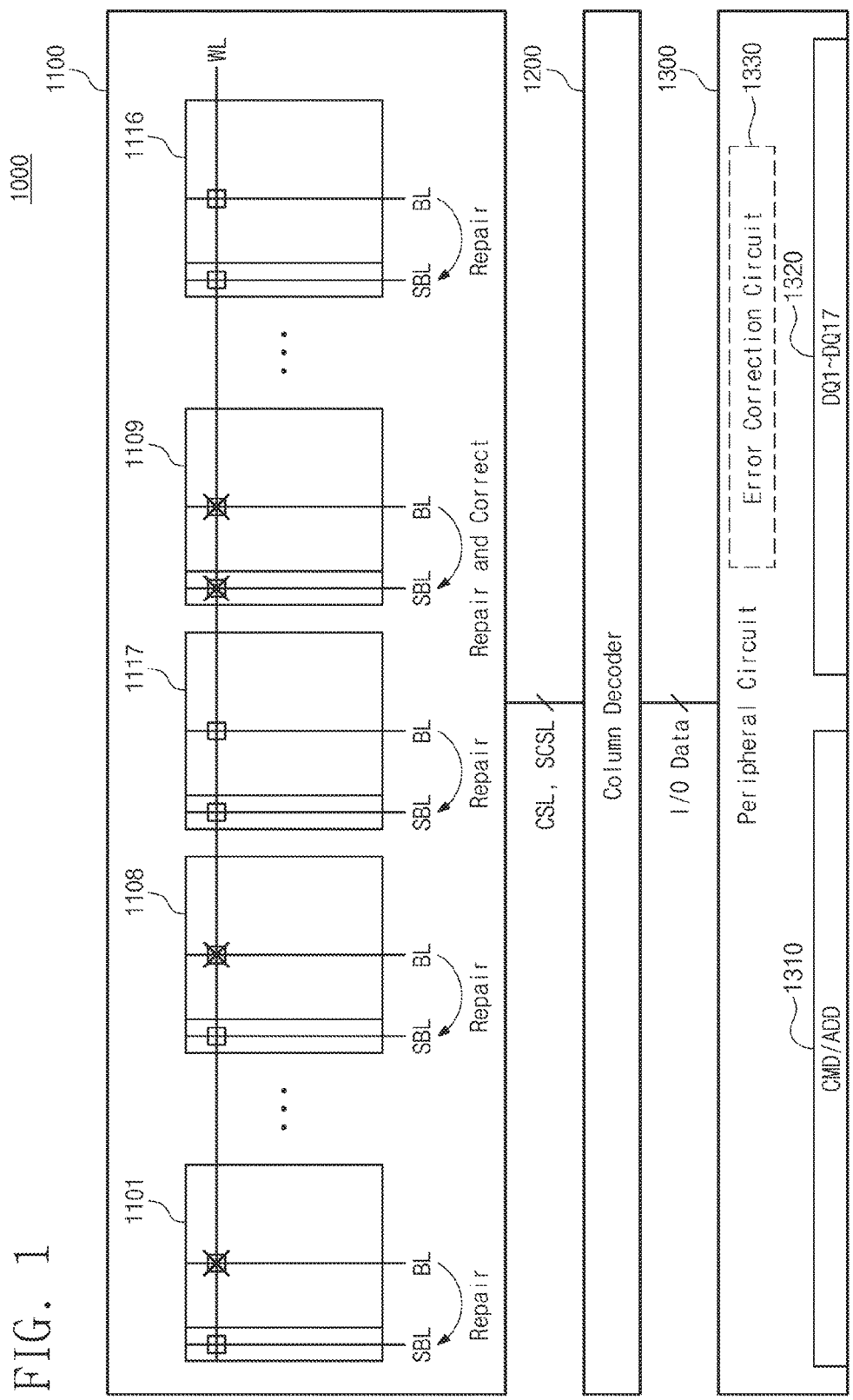
FIG. 1 illustrates a block diagram of a memory device, according to an embodiment of the inventive concept.

FIG. 1 illustrates a block diagram of a memory device, according to an embodiment of the inventive concept. Referring to FIG. 1, a memory device 1000 includes a memory cell array 1100, a column decoder 1200, and a peripheral circuit 1300.

The memory cell array 1100 may include first to seventeenth mats 1101 to 1117 (to simplify the drawings, only mats 1101, 1108, 1109, 1116 and 1117 are shown). Referring to FIG. 1, the mats may be sequentially arranged in the memory cell array 1100 in the order of the first to eighth mats 1101 to 1108, the seventeenth mat 1117, and the ninth to sixteenth mats 1109 to 1116. The seventeenth mat 1117 may store meta data (e.g., parity data) associated with normal data stored in the first to sixteenth mats 1101 to 1116. The arrangement of the seventeenth mat 1117 as disposed between the eighth mat 1108 and the ninth mat 1109 is not limited as shown in FIG. 1. For example, the seventeenth mat 1117 may be disposed at any location in the memory cell array 1100 such as at a left side of the first mat 1101 or a right side of the sixteenth mat 1116. Also, although the memory cell array 1100 is described as including 17 mats 1101 through 1117, in other embodiments the memory cell array 1100 may include more or less mats than the 17 as described with respect to FIG. 1.

The first to seventeenth mats 1101 to 1117 may be configured and implemented the same with respect to each other. For brevity of illustration, in FIG. 1, one bit line BL from among a plurality of bit lines BL (not shown) and one spare bit line SBL from among a plurality of spare bit lines SBL (not shown) are illustrated in each mat, and one word line WL from among a plurality of word lines WL (not shown) is illustrated. Referring to FIG. 1, the first to seventeenth mats 1101 to 1117 share the word line WL (and other word lines), but do not share bit lines BL and spare bit lines SBL. That is, bit lines BL and spare bit lines SBL in one of the first to seventeenth mats 1101 to 1117 do not extend into other of the first to seventeenth mats 1101 to 1117. A detailed configuration of each of the first to seventeenth mats 1101 to 1117 will be described with reference to FIG. 2.

In the first mat 1101, a data input/output associated with a memory cell connected to the word line WL and the bit line BL may be performed through a first input/output pad DQ1 which is disposed as one of the first to seventeenth input/output pads DQ1 to DQ17 1320 of the peripheral circuit 1300. Likewise, in each of the second to seventeenth mats 1102 to 1117, a data input/output associated with a memory cell connected to the word line WL and the bit line BL may be performed through the corresponding one of second to seventeenth input/output pads DQ2 to DQ17 1320 of the peripheral circuit 1300. However, the relationship between a mat and an input/output pad, the number of mats, and the number of input/output pads are not limited to as described with respect to FIG. 1, and various other configurations may be realized.

Figure 14:
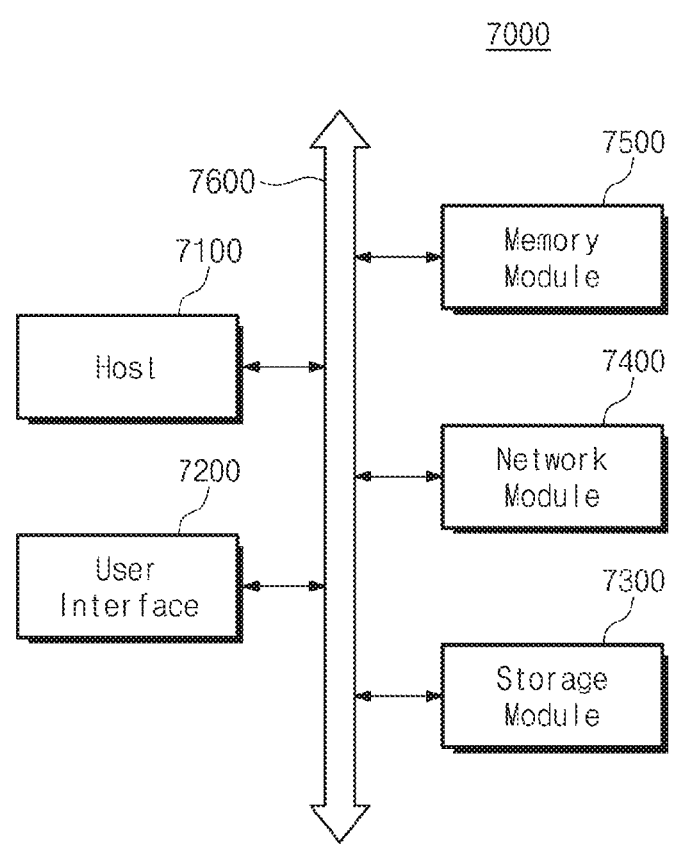
FIG. 14 illustrates a block diagram of an application example of a memory device, according to an embodiment of the inventive concept.

The memory device 1000 may receive an activation command before receiving a write command or a read command from the outside (e.g., a memory controller of a host such as host 7100 shown in FIG. 14 or test equipment). All memory cells connected to the word line of the memory device 1000 may be selected based on the activation command. Afterwards, if the memory device 1000 receives the write command or the read command, a plurality of bit lines may be selected. In an embodiment, the bit lines BL illustrated in the first to seventeenth mats 1101 to 1117 may be selected by the write command or the read command The data input/output may be performed on memory cells connected to the selected bit lines BL.

As described above, data stored in memory cells of the first to sixteenth mats 1101 to 1116 may be normal data, and data (i.e., error correction data) for correcting an error of the normal data may be stored in a memory cell of the seventeenth mat 1117. Here, a combination of the normal data and the error correction data added to the normal data may be referred to as a "code word". That is, the data input/output corresponding to the code word may be performed according to the write command or the read command in the memory cell array 1100.

In an embodiment, the error correction data may be parity data generated by performing error correction encoding on the normal data. In the case where error correction encoding and decoding are performed outside the memory device 1000, the data input/output of the seventeenth mat 1117 may be performed through the seventeenth input/output pad DQ17. In the case where the error correction encoding and decoding are performed within the memory device 1000 (i.e., in the case where the memory device 1000 includes an on-chip error correction code (ECC) circuit), data of the seventeenth mat 1117 may not be input or output through the seventeenth input/output pad DQ17. In the case that the memory device 1000 includes an on-chip error correction code (ECC) circuit, the seventeenth pad DQ17 may be removed from the memory device 1000.

The column decoder 1200 may be connected with the memory cell array 1100 through column select lines CSL and spare column select lines SCSL. The column decoder 1200 may select the column select lines CSL or the spare column select lines SCSL based on a write command or a read command. If the column decoder 1200 selects the column select lines CSL, the bit lines BL are selected. As in the above description, if the column decoder 1200 selects the spare column select lines SCSL, the spare bit lines SBL are selected. Hereinafter, a column repair according to an embodiment of the inventive concept will be described.

In FIG. 1, it is assumed that there are defects in memory cells of the first, eighth, and ninth mats 1101, 1108, and 1109 connected to the word line WL and the bit lines BL. Also, it is assumed that there is a defect in a memory cell of the ninth mat 1109 connected to the word line WL and the spare bit line SBL. The defective memory cells are indicated by "X" in FIG. 1.

Referring to FIG. 1, the number (3) of defective memory cells connected to the bit lines BL may be more than the number (1) of defective memory cells connected to the spare bit lines SBL. The number of errors that are correctable by the error correction encoding and decoding is limited. Therefore, in the following description it is assumed that an error of data stored in memory cells connected to the word line WL and the bit lines BL illustrated in FIG. 1 is uncorrectable by the error correction encoding and decoding, and an error of data stored in memory cells connected to the word line WL and the spare bit line SBL is correctable by the error correction encoding and decoding.

As described above, the column decoder 1200 may select all the bit lines BL illustrated in the first to seventeenth mats 1101 to 1117 based on the write command or the read command Referring to FIG. 1, memory cells of the first and eighth mats 1101 and 1108 connected to the illustrated bit lines BL may be respectively substituted with memory cells connected to the spare bit lines SBL. However, a memory cell of the ninth mat 1109 connected to the illustrated bit line BL may fail to be substituted with a memory cell connected to the spare bit line SBL of the ninth mat 1109, because the memory cell connected to the spare bit line in the ninth mat 1109 is defective as indicated by "X". Accordingly, in the case of a normal memory device, all the bit lines BL of the first to seventeenth mats 1101 to 1117 may fail to be used due to an error of a spare memory cell of the ninth mat 1109. This may result in decrease in the yield of the memory device.

However, according to embodiments of the inventive concept, memory cells connected to the bit lines BL of the first to seventeenth mats 1101 to 1117 may be simultaneously substituted with memory cells connected to the spare bit lines SBL (i.e., memory cells connected to the spare bit lines SBL are selected instead of memory cells connected to the bit lines BL). As such, a defective memory cell of the ninth mat 1109 connected to the bit line BL may be substituted with a defective spare memory cell, and defect-free memory cells of the sixteenth and seventeenth mats 1116 and 1117 may be also substituted. Since the number of defects decreases through the column repair according to embodiments of the inventive concept (from 3 to 1), an error of data stored in the repaired (or substituted) memory cells (memory cells connected to the spare bit lines SBL) may be corrected by the error correction encoding and decoding. That is, if all memory cells corresponding to the code word are simultaneously substituted with spare memory cells, the spare bit line SBL of the ninth mat 1109 may be used. Since data in a defective spare memory cell may be corrected by the error correction encoding and decoding and is thus usable, the yield of the memory device 1000 according to an embodiment of the inventive concept may increase.

The peripheral circuit 1300 may include command and address pads (CMD/ADD) 1310, the first to seventeenth input/output pads DQ1 to DQ17 1320, and an error correction circuit 1330 (or an error correction code (ECC) circuit). As described above, in the case where the error correction encoding and decoding are performed within the memory device 1000, the peripheral circuit 1300 may include only the first to sixteenth input/output pads DQ1 to DQ16.

The peripheral circuit 1300 may provide a column address (not shown) to the column decoder 1200 according to a command (e.g., a read command or a write command) received from the outside (e.g., a memory controller of a host) of the memory device 1000. The peripheral circuit 1300 may provide input data (i.e., I/O Data) to the column decoder 1200 in response to the write command or may receive output data (i.e., I/O Data) from the column decoder 1200 in response to the read command The input data may be input to the peripheral circuit 1300 through the first to seventeenth input/output pads DQ1 to DQ17. The output data may be output to the outside (e.g., a memory controller of a host) of the memory device 1000 through the first to seventeenth input/output pads DQ1 to DQ17.

The error correction circuit 1330 may generate parity data by performing error correction encoding on the input data (i.e., normal data). The input data and the parity data may be together stored in the first to seventeenth mats 1101 to 1117. Afterwards, the error correction circuit 1330 may correct an error of data by performing error correction decoding on data read from the first to seventeenth mats 1101 to 1117. The error-corrected data may be output to the outside through the first to seventeenth input/output pads DQ1 to DQ17.

The error correction circuit 1330 may correct an error by using coded modulation such as for example a low density parity check (LDPC) code, a Bose, Chaudhuri, Hocquenghem (BCH) code, a turbo code, a Reed-Solomon code, a convolution code, a recursive systematic code (RSC), a trellis-coded modulation (TCM), or a block coded modulation (BCM), or other appropriate coded modulation schemes.

In other embodiments of the inventive concept, the peripheral circuit 1300 may not include the error correction circuit 1330. In this case, the error correction encoding and decoding may be performed in the outside (e.g., a memory controller of a host) of the memory device 1000.

Figure 2:
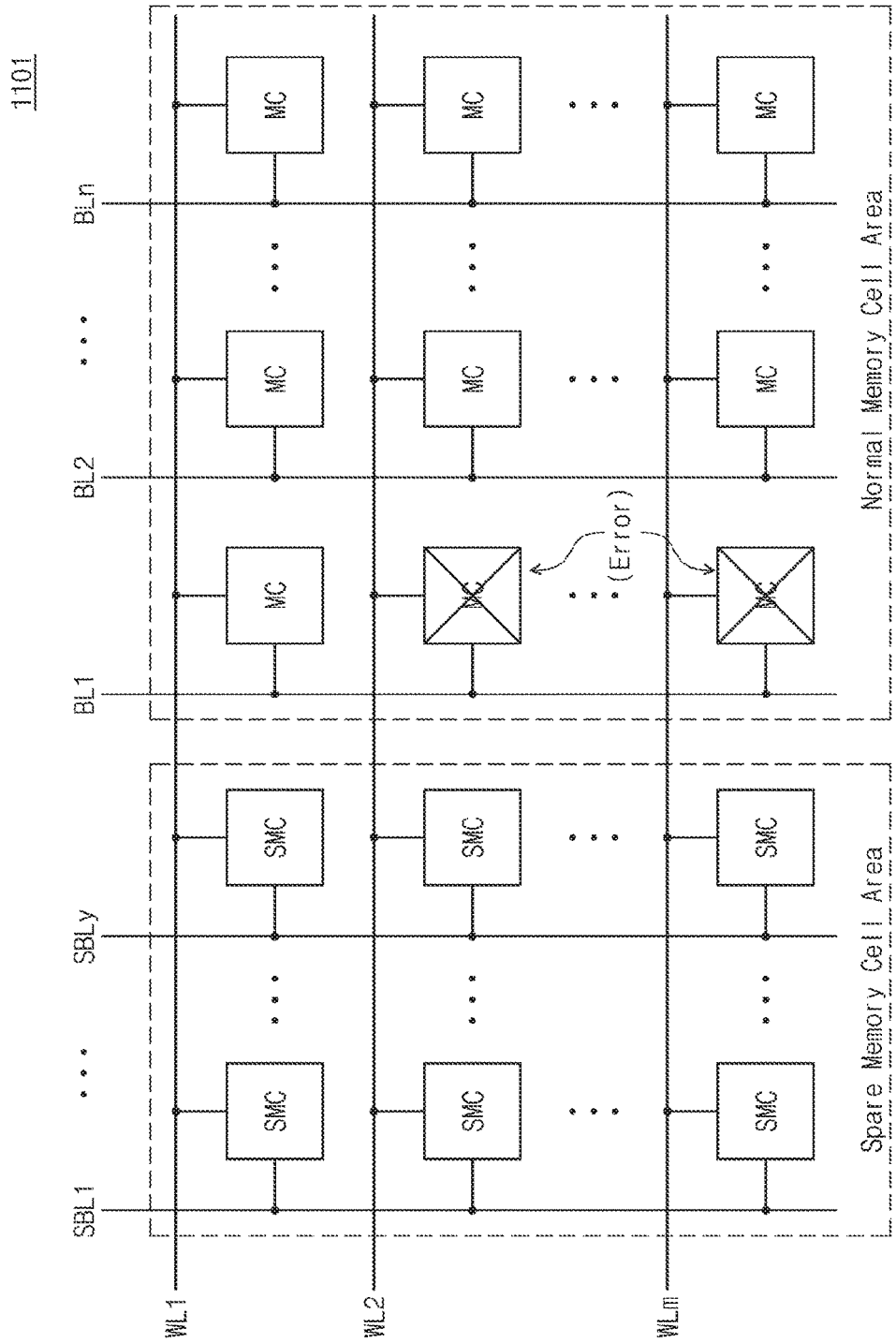
FIG. 2 illustrates a block diagram detailing a first mat shown in FIG. 1.

FIG. 2 illustrates a block diagram detailing the first mat shown in FIG. 1. In particular, FIG. 2 illustrates a block diagram of first mat 1101. In embodiments of the inventive concept, each of the second through seventeenth mats 1102 through 1117 may be implemented and configured the same as the first mat 1101 shown in FIG. 2. Referring to FIG. 2, the first mat 1101 includes a normal memory cell area and a spare memory cell area. The normal memory cell area includes memory cells (MC). For example, each memory cell may be a dynamic random access memory (DRAM) cell, a static random access memory (SRAM) cell, or the like. Alternatively, each memory cell may be a non-volatile memory cell. For example, each memory cell may be a NOR flash memory cell, a NAND flash memory cell, a ferroelectric random access memory (FeRAM) cell, a phase change random access memory (PRAM) cell, a thyristor random access memory (TRAM) cell, a resistive random access memory (ReRAM) cell, a magnetic random access memory (MRAM) cell, or the like.

The spare memory cell area includes spare memory cells (SMC). The spare memory cells and the memory cells may be implemented to have the same configuration. When a defect is generated in a memory cell, the defective memory cell may be repaired through (or by use of) the spare memory cell (the defective memory cell may be substituted with the spare memory cell). This is shown for example in FIG. 1, where in the first mat 1101 the defective memory cell connected to the bit line BL is replaced by the spare memory cell connected to the spare bit line, and "Repair" is thus indicated at the first mat 1101. In other embodiments of the inventive concept, the spare memory cell area may be disposed on a right side of the normal memory cell area, or on the right side of the normal memory cell area in addition to on the left side of the normal memory cell area.

A failure that occurs in data stored in a memory cell may be roughly classified as a hard error or a soft error. A hard error may occur for example when a memory cell is physically damaged, or in other words the hardware of the memory cell is damaged. A soft error may mean a case where the hardware of a memory cell is not damaged, but data of the memory cell temporarily transitions due to alpha particles for example, or other reasons not related to the hardware of the memory cell itself. A hard error may be corrected through (or by substitution with) a spare memory cell or by error correction encoding and decoding. A soft error may be corrected through the error correction encoding and decoding.

Referring to FIG. 2, the normal memory cell area including memory cells MC (i.e., a first plurality of memory cells) may be connected with a plurality of word lines WL1, WL2 to WLm and a plurality of bit lines BL1, BL2 to BLn (i.e., a first plurality of bit lines). The spare memory cell area including spare memory cells SMC (i.e., a second plurality of memory cells) may be connected with the plurality of word lines WL1, WL2 to WLm and a plurality of spare bit lines SBL1 to SBLy (i.e., a second plurality of bit lines). Below, the plurality of spare bit lines SBL are referred to as "column redundancy". Here, each of "m" and "n" may be a positive integer and may be determined by characteristics (e.g., capacitance of a bit line and an area) and/or specifications of a memory device, among other considerations. For example, "m" may be 384, 512, 640, 767, 832, 1024, or other appropriate positive integers, and "n" may be 512, 1024, 2048, or other appropriate positive integers. However, embodiments of the inventive concept are not limited by the above-described numerical values. Also in FIG. 2, "y" indicates the number of spare bit lines. That is, the yield of the memory device may be improved as "y" increases. However, the area of the memory device may increase at the same time with the improvement of the yield. Hereinafter, a column repair operation will be described.

For example, with further regard to FIG. 2, it is assumed that from among memory cells connected to the first bit line BL1 there are defects in memory cells marked by "X". Data in the memory cells indicated by "X" may be in an error state. When an access to the first bit line BL1 is requested from the outside (e.g., a host or a processor) to the memory device, the first spare bit line SBL1 may be selected instead of the first bit line BL1. That is, it may seem to an external device (e.g., a host or a processor) that the first bit line BL1 is selected, but the first spare bit line SBL1 may be actually selected instead of the first bit line BL1 within the memory device. Of course, any one of the spare bit lines SBL2 to SBLy may be selected instead of the first bit line BL1.

Although not illustrated in FIG. 2, the first mat 1101 may further include spare word lines and spare memory cells connected with the spare word lines. For example, the spare word lines may be disposed after m-th word line WLm and/or may be disposed before first word line WL1. A spare word line or a spare bit line may be used according to a defect location of a memory cell.

Figure 3:
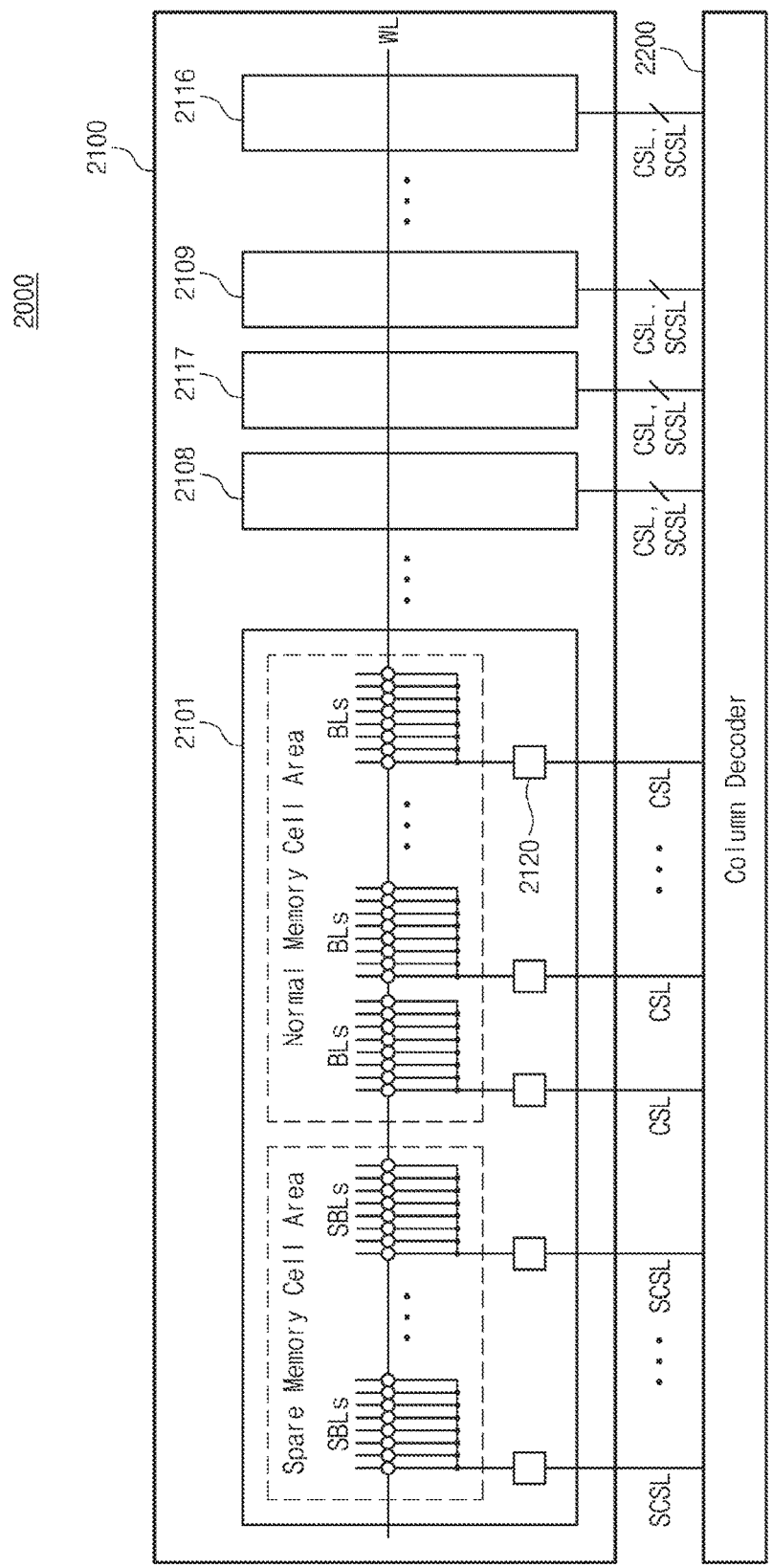
FIG. 3 illustrates a block diagram detailing a relationship between column select lines and bit lines shown in FIG. 1.

FIG. 3 illustrates a block diagram detailing a relationship between column select lines and bit lines shown in FIG. 1. Referring to FIG. 3, a memory device 2000 includes a memory cell array 2100 and a column decoder 2200. The memory cell array 2100 may include first to seventeenth mats 2101 to 2117 (to simplify the drawings, only mats 2101, 2108, 2109, 2116 and 2117 are shown). Also for the sake of brevity of illustration, only the first mat 2101 is shown in detail in FIG. 3. Each of the second to seventeenth mats 2102 to 2117 may be configured and/or implemented the same as the first mat 2101. Also, for brevity of illustration, only one word line WL is illustrated in FIG. 3, and the peripheral circuit 1300 of FIG. 1 is not illustrated.

The column decoder 2200 may select the column select lines CSL of each of the first to seventeenth mats 2101 to 2117 based on a write command or a read command received from the outside. Each of the column select lines CSL may be connected with a plurality of bit lines BLs through a switch 2120. The switch 2120 may be implemented with an N-channel metal oxide semiconductor (NMOS) transistor, a P-channel metal oxide semiconductor (PMOS) transistor, or both NMOS and PMOS transistors. Although 8 bit lines BLs are shown in FIG. 3 as connected to a column select line CSL through a switch 2120, in other embodiments of the inventive concept any suitable number of bit lines BLs greater or less than 8 may be connected to a column select line CSL through a switch 2120.

As described above, a data input/output associated with the first mat 2101 may be performed on the first mat 2101 through the first input/output pad DQ1. In an embodiment, 8-bit data may be input and output through the first input/output pad DQ1 by the write command or the read command The number of data bits input/output through an input/output pad depending on the write command or the read command is referred to as a "burst length bl". However, the burst length is not limited to the above-described number.

The column decoder 2200 may independently select the spare column select lines SCSL of each of the first to seventeenth mats 2101 to 2117 based on a write command or a read command received from the outside. The spare column select lines SCSL may be connected with a plurality of spare bit lines SBLs through the switch 2120. The column decoder 2200 may select a spare column select line SCSL instead of a column select line CSL connected to a defective memory cell. That is, the column repair may mean an operation in which the column decoder 2200 selects a spare column select line SCSL instead of a column select line CSL.

Figure 4:
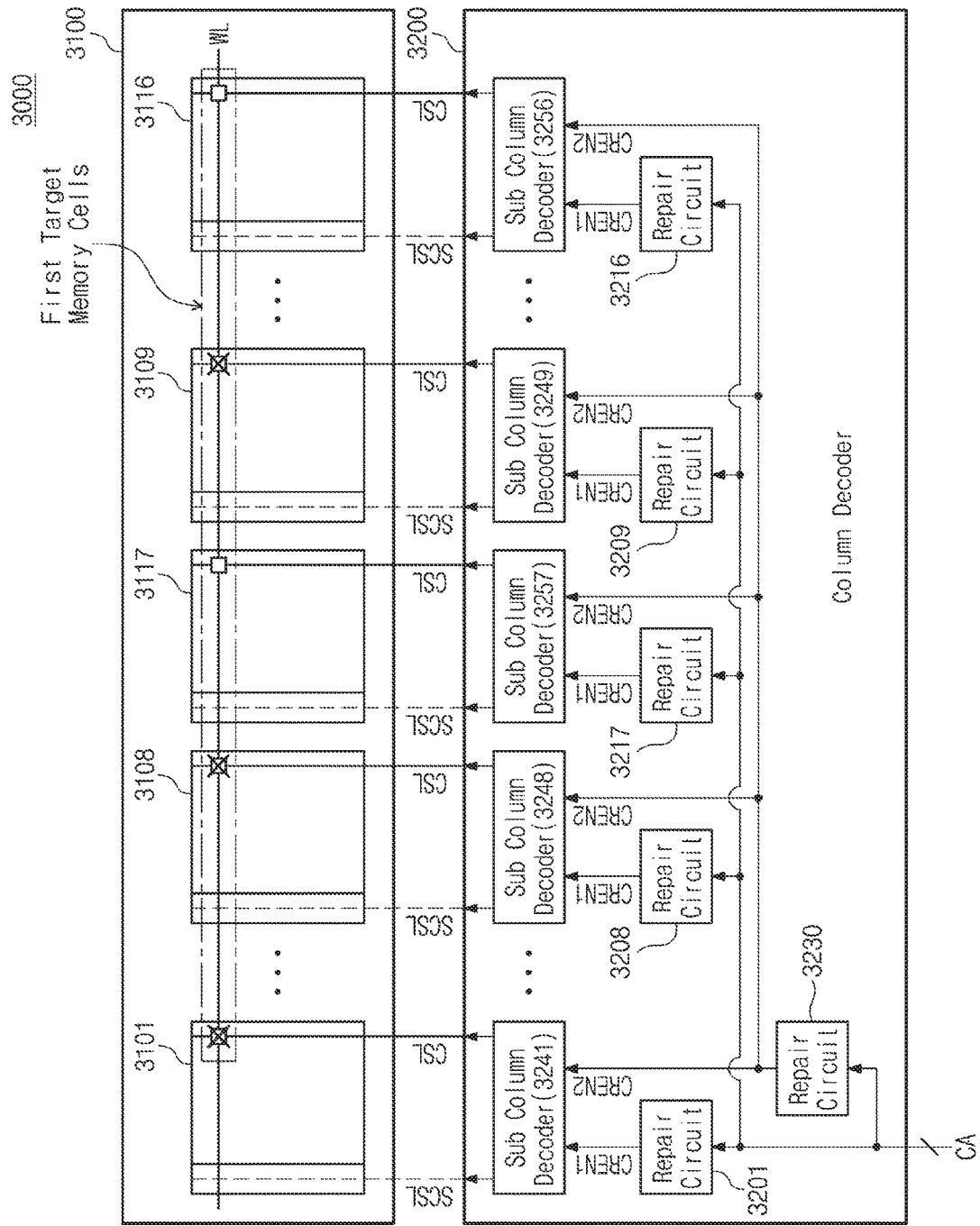
FIG. 4 illustrates a block diagram of a memory device, according to an embodiment of the inventive concept.
Figure 5:
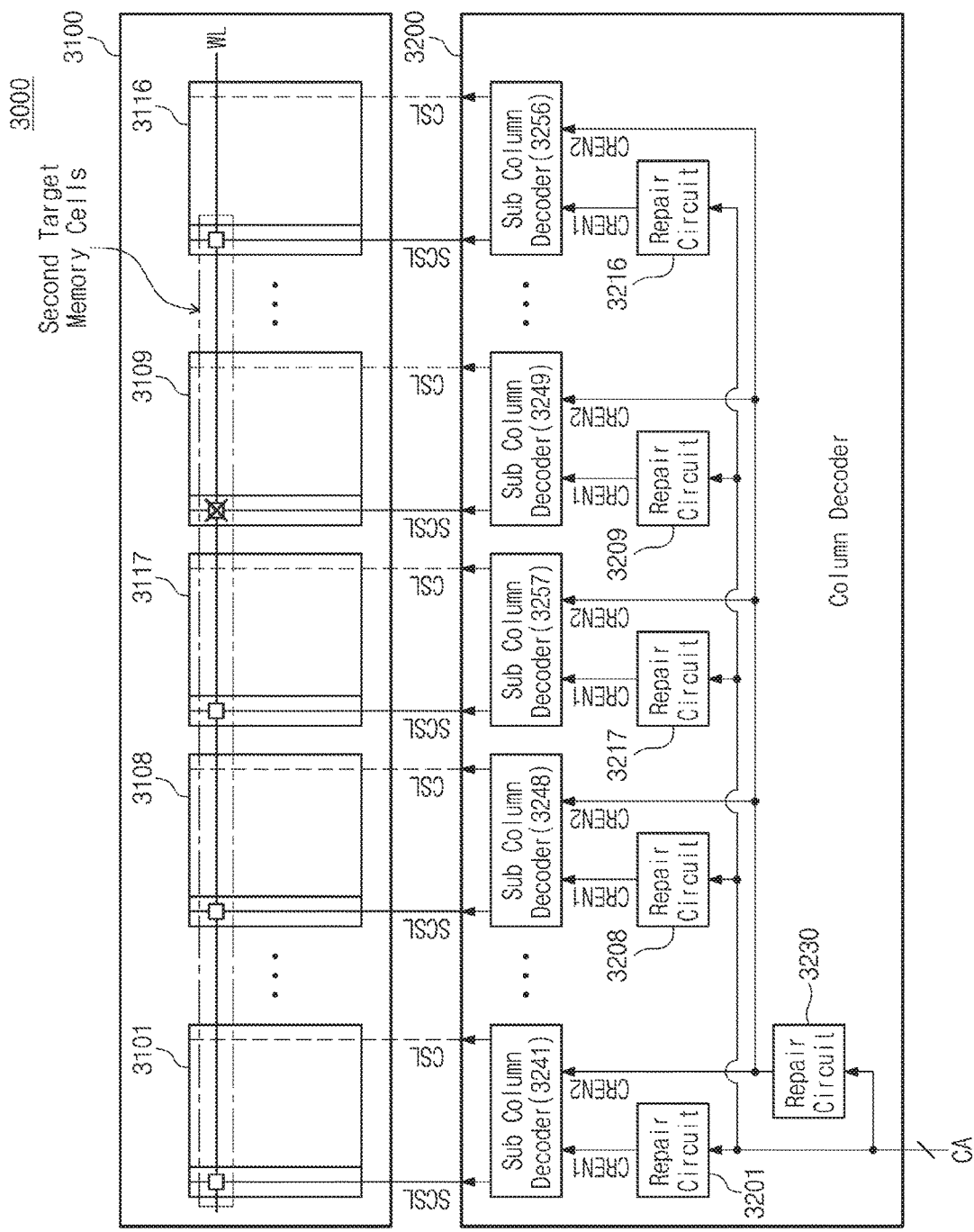
FIG. 5 illustrates a block diagram of the memory device shown in FIG. 4.

FIG. 4 illustrates a block diagram of a memory device, according to an embodiment of the inventive concept. FIG. 5 illustrates a block diagram of the memory device shown in FIG. 4. Referring to FIGS. 4 and 5, a memory device 3000 includes a memory cell array 3100 and a column decoder 3200. The memory cell array 3100 may include first to seventeenth mats 3101 to 3117 (to simplify the drawings, only mats 3101, 3108, 3109, 3116 and 3117 are shown). The first to seventeenth mats 3101 to 3117 may perform the same function as described with reference to FIGS. 1 to 3.

The column decoder 3200 includes first repair circuits 3201 to 3217 (to simplify the drawings, only first repair circuits 3201, 3208, 3209, 3216 and 3217 are shown), a second repair circuit 3230, and the first to seventeenth sub column decoders 3241 to 3257 (to simplify the drawings, only sub column decoders 3241, 3248, 3249, 3256 and 3257 are shown). The first repair circuits 3201 to 3217 are respectively connected with the first to seventeenth sub column decoders 3241 to 3257. The second repair circuit 3230 is connected with all the first to seventeenth sub column decoders 3241 to 3257. The first to seventeenth sub column decoders 3241 to 3257 are respectively connected with the first to seventeenth mats 3101 to 3117.

The first repair circuit 3201 may receive a column address CA from the peripheral circuit 1300 (refer to FIG. 1). Column addresses (hereinafter referred to as "repair column addresses RCA") that are necessary for repair may be stored in advance in the first repair circuit 3201. That is, the first repair circuit 3201 may be characterized as storing a first repair column address. The first repair circuit 3201 may check whether the received column address CA coincides with any one of the repair column addresses RCA. If the received column address CA coincides with any one of the repair column addresses RCA, the first repair circuit 3201 may provide a first repair enable signal CREN1 to the first sub column decoder 3241. If the first repair enable signal CREN1 is activated, the first sub column decoder 3241 may select the spare column select line SCSL instead of the column select line CSL.

Each of the remaining first repair circuits 3202 to 3217 may be configured and/or implemented the same as the first repair circuit 3201. The repair column addresses RCA stored in each of the first repair circuits 3201 to 3217 may be determined in advance through a wafer test, a package test, or the like depending on a defective bit line of each of the first to seventeenth mats 3101 to 3117. Accordingly, the repair column addresses RCA stored in each of the first repair circuits 3201 to 3217 may be the same as or different from each other. Since the first repair circuits 3201 to 3217 are disposed as respectively corresponding to different ones of the first to seventeenth mats 3101 to 3117, the column decoder 3200 may independently perform column repair on each of the first to seventeenth mats 3101 to 3117. That is, column decoder 3200 may for example perform column repair on the first mat 3101 independently of performing column repair on another of the second to seventeenth mats 3102 to 3117.

The second repair circuit 3230 may be implemented the same as the first repair circuit 3201. That is, the second repair circuit 3230 may compare the received column address CA with the repair column addresses RCA stored in advance, and may generate a second repair enable signal CREN2. The second repair circuit 3230 may be characterized as storing a second repair column address. Unlike the first repair circuit 3201, the second repair circuit 3230 may provide the second repair enable signal CREN2 to all the first to seventeenth sub column decoders 3241 to 3257. If the second repair enable signal CREN2 is activated, each of the first to seventeenth sub column decoders 3241 to 3257 may select the spare column select lines SCSL instead of the column select lines CSL.

Each of the plurality of sub column decoders 3241 to 3257 may be configured the same as each other. Each of the plurality of sub column decoders 3241 to 3257 may select a column select line CSL with reference to a column address CA, or may select a spare column select line SCSL with reference to a first repair enable signal CREN1 and a second repair enable signal CREN2. A detailed structure of the a plurality of sub column decoders 3241 to 3257 will be described with reference to FIG. 7.

In an embodiment of the inventive concept, the column decoder 3200 may select other bit lines instead of bit lines corresponding to the received column address in one mat among the plurality of the first to seventeenth mats 3101 to 3117, when the received column address coincides with a repair column address stored in one repair circuit among the first repair circuits 3201 to 3217. The column decoder 3200 may select other bit lines instead of bit lines corresponding to the received column address in the plurality of the first to seventeenth mats 3101 to 3117, when the received column address coincides with a repair column address stored in the second repair circuit 3230.

In FIGS. 4 and 5, as indicated by "X", it is assumed that there are defects in memory cells of the first, eighth, and ninth mats 3101, 3108, and 3109 which are disposed at intersections of the word line WL and the column select line CSL. Also, it is assumed that there is a defect in a memory cell of the ninth mat 3109, which is disposed at an intersection of the word line WL and the spare column select line SCSL (refer to FIG. 5).

The memory device 3000 may receive the activation command before receiving the write command or the read command The memory device 3000 may activate the illustrated word line WL based on the activation command Afterwards, the column decoder 3200 may select the illustrated column select lines CSL (illustrated by a solid line) based on the write command or the read command.

Memory cells of the first to seventeenth mats 3101 to 3117 that are selected by the word line WL and the column select lines CSL may be referred to as a "first plurality of target memory cells". The first plurality of target memory cells may be connected with a first plurality of target bit lines. Data corresponding to a code word may be stored in the first plurality of target memory cells or may be read from the first plurality of target memory cells. For example, the number of the first plurality of target memory cells may be a total of 136 (17 (DQ) by 8 (b1)=136), and the code length may be 136 bits. Here, the code length may mean a size corresponding to a sum of normal data and an error correction encoding result (parity data) of the normal data, that is, a size of the code word.

As illustrated in FIG. 4, there may be defects in memory cells, which belong to the first, eighth, and ninth mats 3101, 3108, and 3109, from among the first plurality of target memory cells. Due to the above-described defects, an error of data stored in the first plurality of target memory cells may exceed a correctable range. This may mean that the error is uncorrectable. In particular, referring to FIG. 5, since there is a defect in a memory cell of the ninth mat 3109 which is disposed at an intersection of the word line WL and the spare column select line SCSL, a fuse set (to be described in FIG. 6) of the first repair circuit 3209 which corresponds to the spare column select line SCSL of the ninth mat 3109 may be unavailable.

According to an embodiment of the inventive concept, the column decoder 3200 may repair (i.e., replace with spare memory cells) all of the first plurality of target memory cells by using the second repair circuit 3230. Column addresses (i.e., repair column addresses) corresponding to the illustrated column select lines CSL may be stored in advance in the second repair circuit 3230. The column decoder 3200 may repair defect-free target memory cells (e.g., target memory cells of the sixteenth and seventeenth mats 3116 and 3117) as well as defective target memory cells.

Referring to FIG. 5, through a repair operation of the column decoder 3200 using the second repair circuit 3230, the spare column select lines SCSL (illustrated by a solid line) of the first to seventeenth mats 3101 to 3117 may be selected instead of the column select lines CSL (illustrated by a dotted line). Here, a second plurality of target memory cells may be memory cells that are connected to the word line WL and the spare column select lines SCSL (i.e., a second plurality of target bit lines). The second plurality of target memory cells may be connected with the second plurality of target bit lines. The second plurality of target bit lines may be connected with the spare column select lines SCSL (illustrated by a solid line) selected by the column decoder 3200.

Referring to FIG. 5, there may be a defect in a spare memory cell, which belongs to the ninth mat 3109, from among the second plurality of target memory cells. Nevertheless, the number of defective memory cells among the second plurality of target memory cells may be less than the number of defective memory cells among the first plurality of target memory cells. That is, the number of errors of data stored in the second plurality of target memory cells may be less than the number of errors of data stored in the first plurality of target memory cells. Accordingly, even though there is a defect in a spare memory cell of the ninth mat 3109, an error of data stored in the second plurality of target memory cells may be corrected by error correction encoding and decoding. This is shown for example in FIG. 1, where in the ninth mat 1109 the defective memory cell connected to the bit line BL is replaced by the spare memory cell and data in the defective spare memory cell is correctable by error correction encoding and decoding, and "Repair and Correct" is thus indicated at the ninth mat 1109.

The column decoder 3200 may respectively perform column repair on each of the first to seventeenth mats 3101 to 3117 by respectively using the first repair circuits 3201 to 3217. The column decoder 3200 may perform column repair on all the first to seventeenth mats 3101 to 3117 by using the second repair circuit 3230. Target memory cells of which the number corresponds to the total size of normal data and parity data may be simultaneously repaired through the second repair circuit 3230. Even through there may be defects in target memory cells repaired through the column repair of the second repair circuit 3230, an error occurring due to the above-described defects may be corrected by the error correction encoding and decoding. That is, defective spare memory cells (memory cells disposed at an intersection of the word line WL and the spare column select line SCSL of FIG. 5) may be usable through the column repair according to an embodiment of the inventive concept. According to an embodiment of the inventive, thus, the yield of the memory device 3000 may increase.

Figure 6:
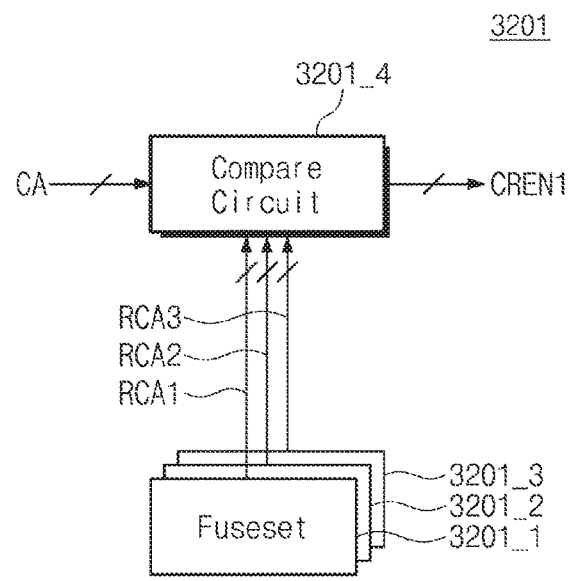
FIG. 6 illustrates a block diagram of a repair circuit shown in FIGS. 4 and 5.

FIG. 6 illustrates a block diagram of a repair circuit shown in FIGS. 4 and 5. In particular, FIG. 6 illustrates a block diagram of the first repair circuit 3201 shown in FIGS. 4 and 5. However, as described previously, the remaining first repair circuits 3202 to 3217 and the second repair circuit 3230 may be configured and/or implemented the same as the first repair circuit 3201. The first repair circuit 3201 as shown in FIG. 6 includes a plurality of fuse sets 3201_1, 3201_2 and 3201_3, and a compare circuit 3201_4.

Repair column addresses RCA1, RCA2 and RCA3 may be stored in the fuse sets 3201_1 to 3201_3, respectively. Each of the fuse sets 3201_1 to 3201_3 may include a plurality of fuses. In each of the fuse sets 3201_1 to 3201_3, the fuses may be selectively cut with reference to the corresponding one of the repair column addresses RCA1 to RCA3. For example, a fuse may be implemented with various non-volatile memories such as an electrically programmable fuse, a laser programmable fuse, an anti-fuse, and a flash memory, or the like. The fuse sets 3201_1 to 3201_3 may provide the repair column addresses RCA1 to RCA3 to the compare circuit 3201_4, respectively.

The compare circuit 3201_4 may compare a column address CA (the same as the column address CA of FIGS. 4 and 5) and the repair column addresses RCA1 to RCA3. In an embodiment, the compare circuit 3201_4 may be implemented with various logic circuits (e.g., AND, NAND, OR, NOR, INV, XOR, and XNOR logic circuits) or switches. If the column address CA coincides with any one of the repair column addresses RCA1 to RCA3, the compare circuit 3201_4 may activate the first repair enable signal CREN1. As described above, the first repair enable signal CREN1 of first repair circuit 3201 may be provided to the first sub column decoder 3241 of FIGS. 4 and 5.

The fuse sets 3201_1 to 3201_3 may correspond to spare column select lines, respectively. For example, if the column address CA coincides with the repair column address RCA1 stored in the fuse set 3201_1, a spare column select line corresponding to the fuse set 3201_1 may be selected instead of a column select line corresponding to the column address CA. Therefore, in the case where there is a defect in a memory cell(s) connected to a spare column select line corresponding to a fuse set, the fuse set may be unavailable.

In FIG. 6 the number of fuse sets 3201_1 to 3201_3 is "3". However, the number of fuse sets 3201_1 to 3201_3 is not limited to "3". For example, in other embodiments of the inventive concept the number of fuse sets may be determined in consideration of a target yield of a memory device or the area of the memory device. The yield of the memory device may increase as the number of fuse sets and the number of spare column select lines increase, but the area of the memory device may increase.

Figure 7:
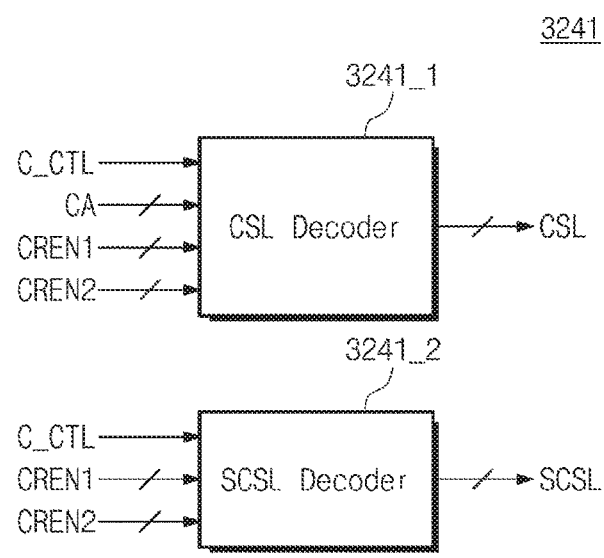
FIG. 7 illustrates a block diagram of a sub column decoder shown in FIGS. 4 and 5.

FIG. 7 illustrates a block diagram of a sub column decoder shown in FIGS. 4 and 5. In particular, FIG. 7 illustrates a block diagram of the first sub column decoder 3241 shown in FIGS. 4 and 5. However, the second to seventeenth sub column decoders 3242 to 3257 may be configured and/or implemented the same as the first sub column decoder 3241. The first sub column decoder 3241 as shown in FIG. 7 includes a column select line (CSL) decoder (i.e., a first column select line decoder) 3241_1 and a spare column select line (SCSL) decoder (i.e., a second column select line decoder) 3241_2.

The column select line decoder 3241_1 may select any one of the column select lines CSL with reference to a column address CA (the same as the column address CA of FIGS. 4 and 5). However, if any one of the first and second repair enable signals CREN1 and CREN2 is activated, the column select line decoder 3241_1 may not select the column select lines CSL. To this end, the column select line decoder 3241_1 may first receive the first and second repair enable signals CREN1 and CREN2 before selecting any one of the column select lines CSL. The column select line decoder 3241_1 may control timing of the above-described operations with reference to a column control signal C_CTL. The column control signal C_CTL may be generated by the peripheral circuit 1300 (refer to FIG. 1). That is, the peripheral circuit 1300 may generate the column control signal C_CTL with reference to the read command or the write command.

The spare column select line decoder 3241_2 may select any one of the spare column select lines SCSL in response to the column control signal C_CTL and the first and second repair enable signals CREN1 and CREN2. Information about whether the column address CA coincides with a repair column address (any one of the repair column addresses RCA1 to RCA3 of FIG. 6) stored in any one of the plurality of fuse sets 3201_1 to 3201_3 (refer to FIG. 6) may be included in the first and second repair enable signals CREN1 and CREN2. The spare column select line decoder 3241_2 may select the spare column select line SCSL corresponding to a fuse set in which a repair column address that is the same as the column address CA is stored.

Figure 8:
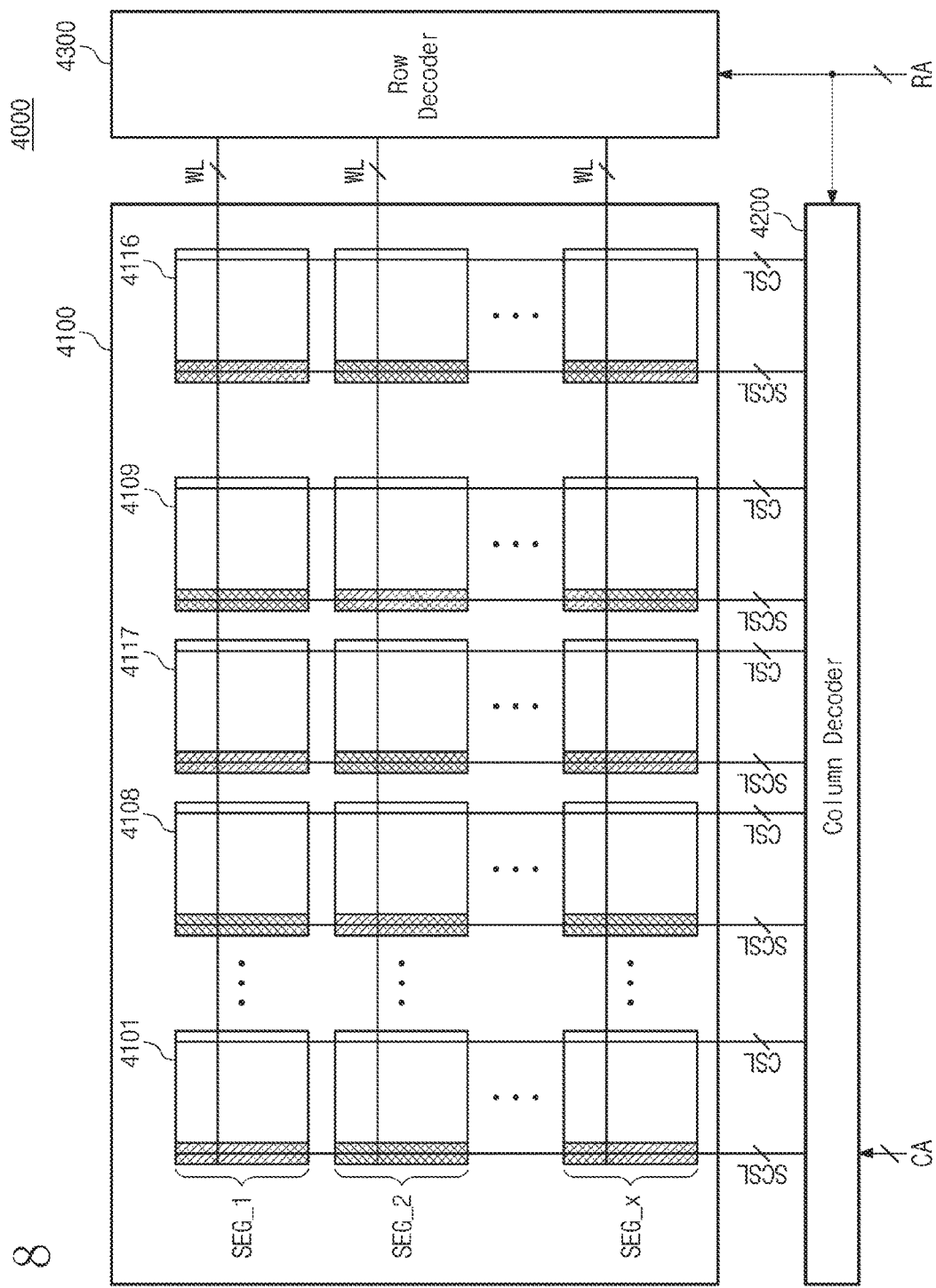
FIG. 8 illustrates a block diagram of a memory device, according to an embodiment of the inventive concept.

FIG. 8 illustrates a block diagram of a memory device, according to an embodiment of the inventive concept. Referring to FIG. 8, a memory device 4000 includes a memory cell array 4100, a column decoder 4200, and a row decoder 4300.

The memory cell array 4100 may include first to seventeenth mats 4101 to 4117 arranged in a first row (to simplify the drawings, only mats 4101, 4108, 4109, 4116 and 4117 in the first row are shown). Additional rows of first to seventeenth mats are included in the memory cell array (to simplify the drawings, the mats of the additional rows are not denoted by reference numerals). Each of the first to seventeenth mats 4101 to 4117 as well as the mats in the additional rows may be the same as the first mat 1101 illustrated in FIG. 2. Each of the first to seventeenth mats 4101 to 4117 as well as the mats in the additional rows includes a shaded area and a non-shaded area. The shaded area indicates the spare memory cell area such as shown in FIG. 2. The non-shaded area indicates the normal memory cell area such as shown in FIG. 2.

The column decoder 4200 may select the column select lines CSL or the spare column select lines SCSL. The row decoder 4300 may select one of a plurality of word lines WL.

Referring to FIG. 8, data stored in the first mat 4101 may be output to the first input/output pad DQ1 (refer to FIG. 1). In addition, data stored in any other mats that are disposed at the same column as the first mat 4101 and share the column select line CSL and the spare column select line SCSL with the first mat 4101 may also be output to the first input/output pad DQ1 (refer to FIG. 1). Likewise, data stored in the remaining mats other than the above-described mats may also be output in the same manner Referring to FIG. 8, a plurality of segments SEG_1 SEG_2 to SEG_x are illustrated. Here, a segment means a unit of column repair, and "x" is a positive integer. In an embodiment, in the case where "x" is "1", the column decoder 4200 may select the spare column select line SCSL in the first mat 4101, instead of selecting the column select line CSL in the first mat 4101 and all other mats disposed at the same column as the first mat 4101.

In another embodiment, as illustrated in FIG. 8, if "x" is the same as the number of mats arranged in a column direction, the column decoder 4200 may independently select the spare column select line SCSL instead of the column select line CSL in each of the mats disposed at the same column.

That is, "x" (the number of segments) may be determined based on the yield and area of a memory device. A column repair operation may be subdivided more and more as "x" becomes larger. As "x" becomes larger, the yield of the memory device may increase; however, the area of the memory device may increase. Below, a segment-based column repair according to an embodiment of the inventive concept will be described.

Figure 9:
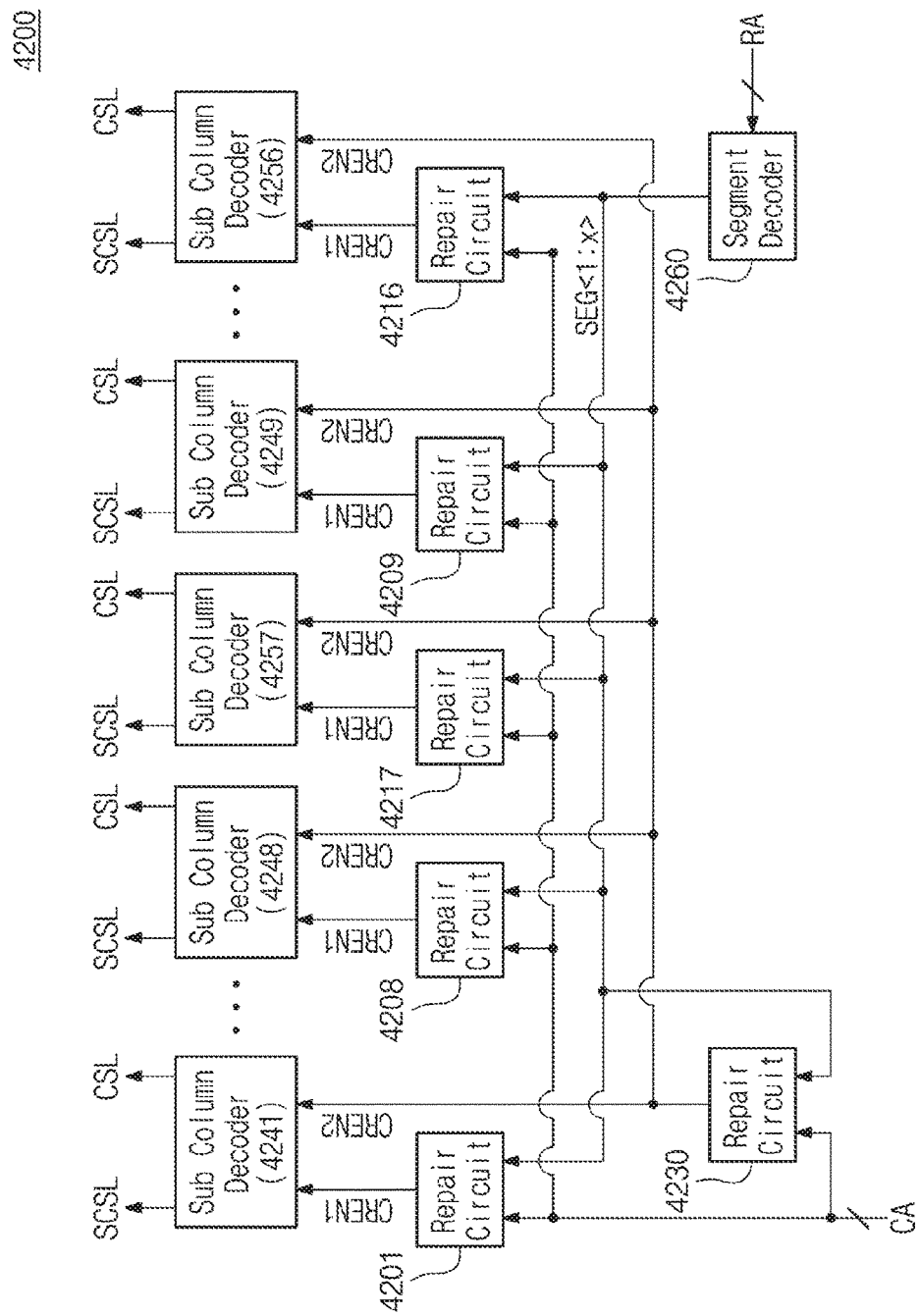
FIG. 9 illustrates a block diagram of a column decoder shown in FIG. 8.

FIG. 9 illustrates a block diagram of a column decoder shown in FIG. 8. Referring to FIG. 9, the column decoder 4200 includes first repair circuits 4201 to 4217 (to simplify the drawings, only first repair circuits 4201, 4208, 4209, 4216 and 4217 are shown), a second repair circuit 4230, first to seventeenth sub column decoders 4241 to 4257 (to simplify the drawings, only sub column decoders 4241, 4248, 4249, 4256 and 4257 are shown), and a segment decoder 4260. Unlike the column decoder 3200 of FIGS. 4 and 5, the column decoder 4200 further includes the segment decoder 4260. Functions of the first repair circuits 4201 to 4217, the second repair circuit 4230, and the first to seventeenth sub column decoders 4241 to 4257 are respectively the same as the first repair circuits 3201 to 3217, the second repair circuit 3230 and the sub column decoders 3241 to 3257 described with reference to FIGS. 4 and 5.

The segment decoder 4260 may receive a row address RA. The row address RA may be provided from the peripheral circuit 1300 (refer to FIG. 1). The segment decoder 4260 may decode the row address RA and may generate segment signals SEG<1:x> with reference to the row address RA responsive to the decoding. The generated segment signals SEG<1:x> may be provided to the first repair circuits 4201 to 4217 and the second repair circuit 4230. The segment signals may be characterized as segment information including information of a row address corresponding to the word line associated with the row address RA.

The segment decoder 4260 may determine an activated word line with reference to the row address RA and may determine a segment at which the activated word line is located. In detail, if any one of the word lines WL connected with the first to seventeenth mats 4101 to 4117 is activated, since the activated word line is included in the segment SEG_1, the segment decoder 4260 may activate the segment signal SEG<1> and may deactivate the remaining segment signals SEG<2:x>. The first repair circuits 4201 to 4217 and the second repair circuit 4230 may perform column repair on a segment at which the activated word line is located, in response to the segment signals SEG<1:x>. Below, a repair circuit that receives the segment signals SEG<1:x> will be described.

Figure 10:
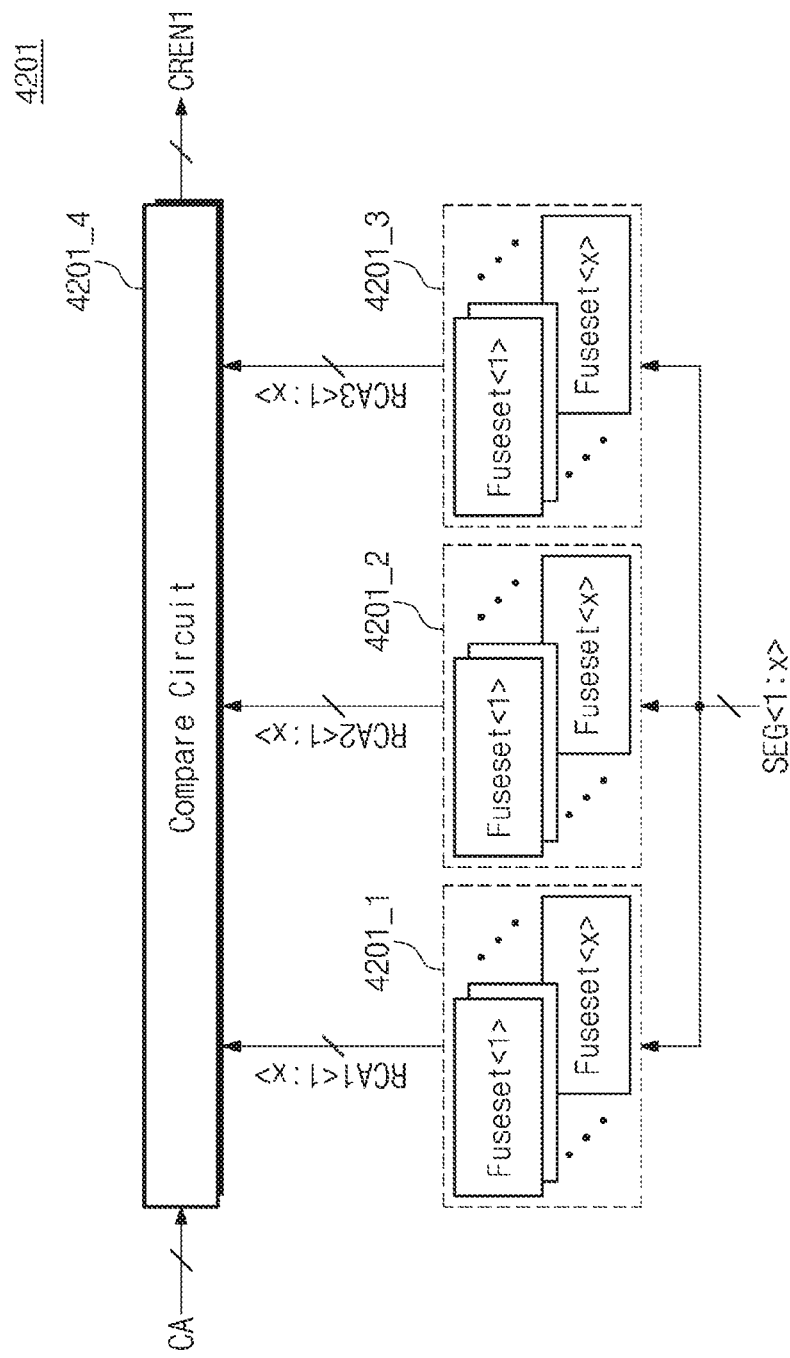
FIG. 10 illustrates a block diagram of the repair circuit shown in FIG. 9.

FIG. 10 illustrates a block diagram of a repair circuit shown in FIG. 9. In particular, FIG. 10 illustrates a block diagram of the first repair circuit 4201 shown in FIG. 9. However, as previously described above, the remaining first repair circuits 4202 to 4217 and the second repair circuit 4230 in FIG. 9 may be configured and/or implemented the same as the first repair circuit 4201. The first repair circuit 4201 as shown in FIG. 10 includes a plurality of fuse set arrays 4201_1, 4201_2 to 4201_3 and a compare circuit 4201_4.

Each of the plurality of fuse set arrays 4201_1 to 4201_3 may include a plurality of fuse sets Fuseset<1:x>. The number of fuse sets Fuseset<1:x> may be the same as the number of segments SEG_1 to SEG_x described above. That is, as the column repair is performed while being subdivided according to a segment, the number of fuse sets Fuseset<1:x> of the repair circuit 4201 may increase.

Repair column addresses RCA1<1:x>, RCA2<1:x>, and RCA3<1:x> stored in the fuse sets Fuseset<1:x> may be the same as or different from each other. The repair column addresses RCA1<1:x>, RCA2<1:x>, and RCA3<1:x> may be determined in advance through a wafer test or a package test based on a column address corresponding to a defective memory cell of a mat included in the corresponding segment. Any one of the fuse sets Fuseset<1:x> may be activated according to the segment signals SEG<1:x>. Repair column addresses may be provided to the compare circuit 4201_4 from the activated fuse sets of each of the plurality of fuse set arrays 4201_1 to 4201_3.

The compare circuit 4201_4 may perform the same function as the compare circuit 3201_4 of FIG. 6. However, compared with the compare circuit 3201_4 of FIG. 6, the compare circuit 4201_4 may be provided with more repair column addresses RCA1<1:x>, RCA2<1:x>, and RCA3<1:x> from the plurality of fuse set arrays 4201_1 to 4201_3 than repair column addresses RCA1, RCA2 and RCA3 as shown in FIG. 6. The compare circuit 4201_4 may compare a column address CA (the same as the column address CA of FIG. 8) with the repair column addresses RCA1<1:x>, RCA2<1:x>, and RCA3<1:x>. If the column address CA coincides with any one of the repair column addresses RCA1<1:x>, RCA2<1:x>, and RCA3<1:x>, the compare circuit 4201_4 may activate the first repair enable signal CREN1. The sub column decoders 4241 to 4257 (refer to FIG. 9) may perform the segment-based column repair by using the first repair enable signal CREN1.

Figure 11:
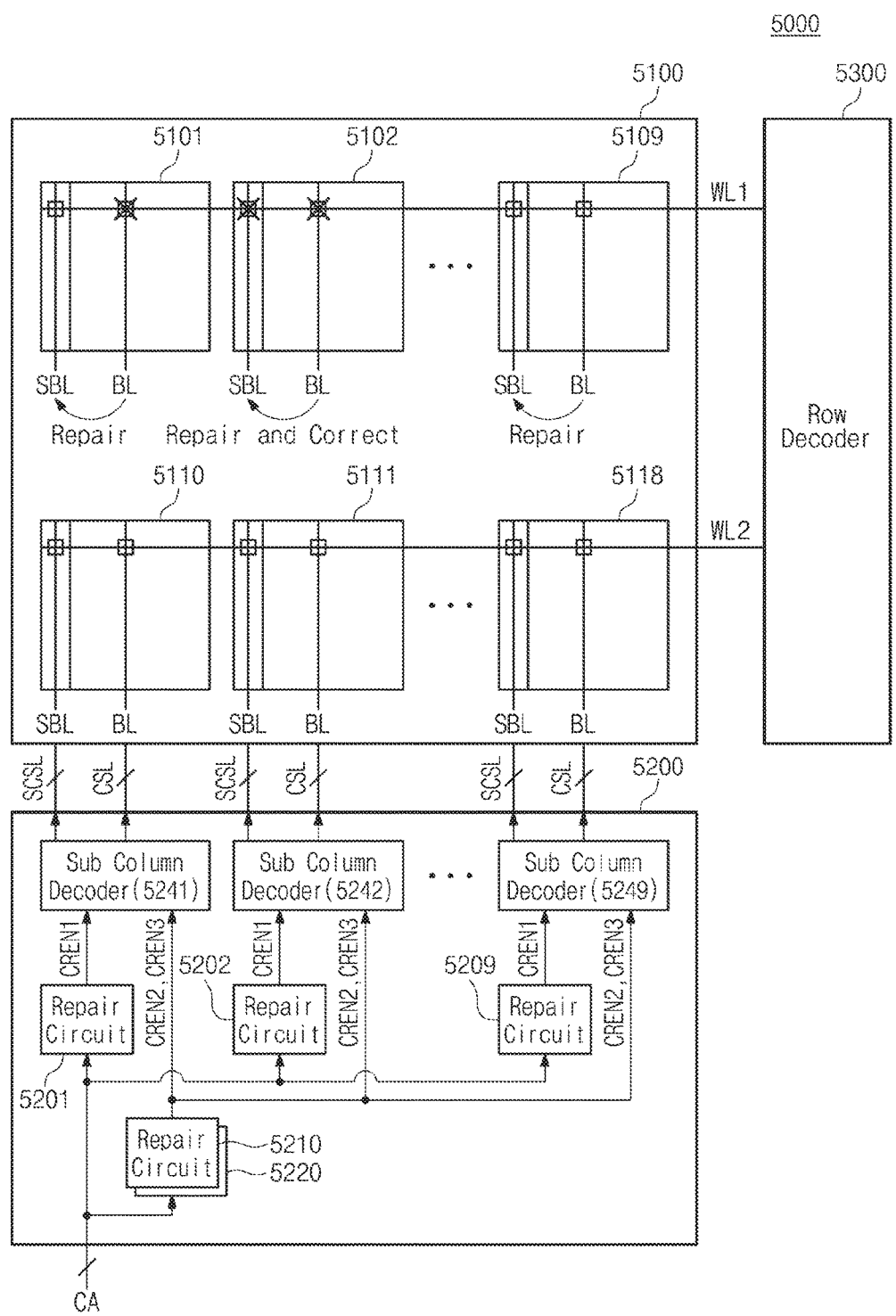
FIG. 11 illustrates a block diagram of a memory device, according to an embodiment of the inventive concept.

FIG. 11 illustrates a block diagram of a memory device, according to an embodiment of the inventive concept. Referring to FIG. 11, a memory device 5000 includes a memory cell array 5100, a column decoder 5200, and a row decoder 5300. FIG. 11 will be described with reference to FIGS. 1 and 8.

The memory cell array 5100 may include first to eighteenth mats 5101 to 5118 (to simplify the drawings, only mats 5101, 5102, 5109, 5110, 5111 and 5118 are shown). Unlike the first to seventeenth mats 1101 to 1117 of FIG. 1, the first to eighteenth mats 5101 to 5118 may not be connected to each other through one word line. Referring to FIG. 11, first to ninth mats 5101 to 5109 (i.e., a first plurality of mats) may be connected with a first word line WL1. Tenth to eighteenth mats 5110 to 5118 (i.e., a second plurality of mats) may be connected with a second word line WL2. In FIG. 11, the first and second word lines WL1 and WL2 may be disposed on a left side with respect to the row decoder 5300. However, in other embodiments the first word line WL1 may be disposed on the left side of the row decoder, and the second word line WL2 may be disposed on a right side of the row decoder 5300. Also, for brevity of illustration, the first to ninth mats 5101 to 5109 and the tenth to eighteenth mats 5110 to 5118 are illustrated as being adjacent to each other. However, in other embodiments of the inventive concept the first to ninth mats 5101 to 5109 and the tenth to eighteenth mats 5110 to 5118 may for example be separately disposed not to share sense amplifiers (not illustrated).

As in the above-described memory device, normal data may be stored in the first to eighth mats 5101 to 5108, and parity data of the normal data may be stored in all or part of the ninth mat 5109. Likewise, normal data may be stored in the tenth to seventeenth mats 5110 to 5117, and parity data of the normal data may be stored in all or part of the eighteenth mat 5118.

The memory device 5000 may receive an activation command from the outside. Unlike the memory device 1000 of FIG. 1, all the first and second word lines WL1 and WL2 may be activated in the memory cell array 5100. That is, the memory device 5000 may activate (i.e., select) at least two word lines of the memory cell array 5100 in response to a single activation command After the first and second word lines WL1 and WL2 are activated according to the activation command, the memory device 5000 may receive the read command or the write command from the outside. Some (i.e., target memory cells) of memory cells connected to the first and second word lines WL1 and WL2 activated by the read command or the write command may be selected. Data corresponding to a code word may be stored in the selected target memory cells.

The column decoder 5200 may include first repair circuits 5201 to 5209 (to simplify the drawings, only first repair circuits 5201, 5202 and 5209 are shown), a second repair circuit 5210, a third repair circuit 5220, and first to ninth sub column decoders 5241 to 5249 (to simplify the drawings, only sub column decoders 5241, 5242 and 5249 are shown). Each of the first repair circuits 5201 to 5209, the second repair circuit 5210, and the third repair circuit 5220 may be configured and/or implemented the same as the repair circuit 3201 of FIG. 6 or the repair circuit 4201 of FIG. 10.

A repair column address corresponding to an illustrated defective bit line of the first mat 5101 may be stored in the first repair circuit 5201. Repair column addresses of the first to ninth mats 5101 to 5109 may be respectively stored in advance in the first repair circuits 5201 to 5209. Also, repair column addresses of the tenth to eighteenth mats 5110 to 5118 may be respectively stored in advance in the first repair circuits 5201 to 5209. The first repair circuits 5201 to 5209 may be respectively connected with the first to ninth sub column decoders 5241 to 5249. That is, the column decoder 5200 may independently perform column repair on each mat by respectively using the first repair circuits 5201 to 5209. Each of the repair circuits 5201 to 5209 may also be characterized as a third repair circuit.

The second and third repair circuits 5210 and 5220 may be connected the first to ninth sub column decoders 5241 to 5249. In detail, the second repair circuit 5210 may provide the second repair enable signal CREN2 to the first to ninth sub column decoders 5241 to 5249. The repair circuit 5210 may also be characterized as a first repair circuit. As in the second repair circuit 5210, the third repair circuit 5220 may provide the third repair enable signal CREN3 to the first to ninth sub column decoders 5241 to 5249. The repair circuit 5220 may be characterized as a second repair circuit.

The second repair circuit 5210 may correspond to a segment in which the first word line WL1 is to be activated, and the third repair circuit 5220 may correspond to a segment in which the second word line WL2 is to be activated. That is, if the column address CA coincides with a repair column address stored in the second repair circuit 5210, the column decoder 5200 may select memory cells connected to the first word line WL1 and the spare bit line SBL, instead of memory cells connected to the first word line WL1 and the bit line BL in all the first to ninth mats 5101 to 5109. As in the above description, if the column address CA coincides with a repair column address stored in the third repair circuit 5220, the column decoder 5200 may select memory cells connected to the second word line WL2 and the spare bit line SBL, instead of memory cells connected to the second word line WL2 and the bit line BL in all the tenth to eighteenth mats 5110 to 5118.

That is, the column decoder 5200 may independently perform the column repair operation of the column decoder 3200 of FIGS. 4 and 5 on memory cells connected to the first word line WL1 and on memory cells connected to the second word line WL2.

Referring to FIG. 11, it is assumed that there are defects in memory cells of the first and second mats 5101 and 5102 as indicated by "X", and it is assumed that there is a defect in a spare memory cell of the second mat 5102. The number (2) of defective memory cells connected to the first word line WL1 and the bit lines BL may be more than the number (1) of defective memory cells connected to the first word line WL1 and the spare bit lines SBL. In addition, it is assumed that there are no defects in memory cells of the tenth to eighteenth mats 5110 to 5118. Memory cells connected to the first word line WL1 and the bit lines BL, and memory cells connected to the second word line WL2 and the bit lines BL, may be referred to as "target memory cells".

Due to the above-described defects, an error of data stored in the target memory cells may exceed a correctable range. This may mean that the error is uncorrectable. In particular, since there is a defect in a memory cell of the second mat 5102 which is connected to the first word line WL and the spare bit line SBL, a fuse set of the first repair circuit 5202 which corresponds to the spare bit line SBL of the second mat 5102 may be unavailable.

The column decoder 5200 may repair all memory cells, which are connected with the first word line WL1, from among target memory cells by using the second repair circuit 5210. In contrast, since there are no defects in memory cells which are connected to the second word line WL2, from among the target memory cells, the column decoder 5200 does not perform column repair on memory cells connected to the second word line WL2.

Referring to FIG. 11, there may be a defect in a spare memory cell, which belongs to the second mat 5102, from among newly selected target memory cells. Nevertheless, the number (1) of detects of newly selected target memory cells may be less than the number (2) of detects of previous target memory cells. That is, the number of errors of data stored in the newly selected target memory cells may be less than the number of errors of data stored in the previous target memory cells. Accordingly, an error of data due to the defective spare memory cell of the second mat 5102 may be corrected by error correction encoding and decoding.

The first to ninth sub column decoders 5241 to 5249 may be connected with the first to eighteenth mats 5101 to 5118. In detail, the first sub column decoder 5241 may be connected with the first mat 5101 and the tenth mat 5110. The second to ninth sub column decoders 5242 to 5249 may be connected to two mats in the same manner as the first sub column decoder 5241. Each of the first to ninth sub column decoders 5241 to 5249 may select the column select lines CSL or the spare column select lines SCSL in the same manner as the sub column decoder 3241 of FIG. 7.

Figure 12:
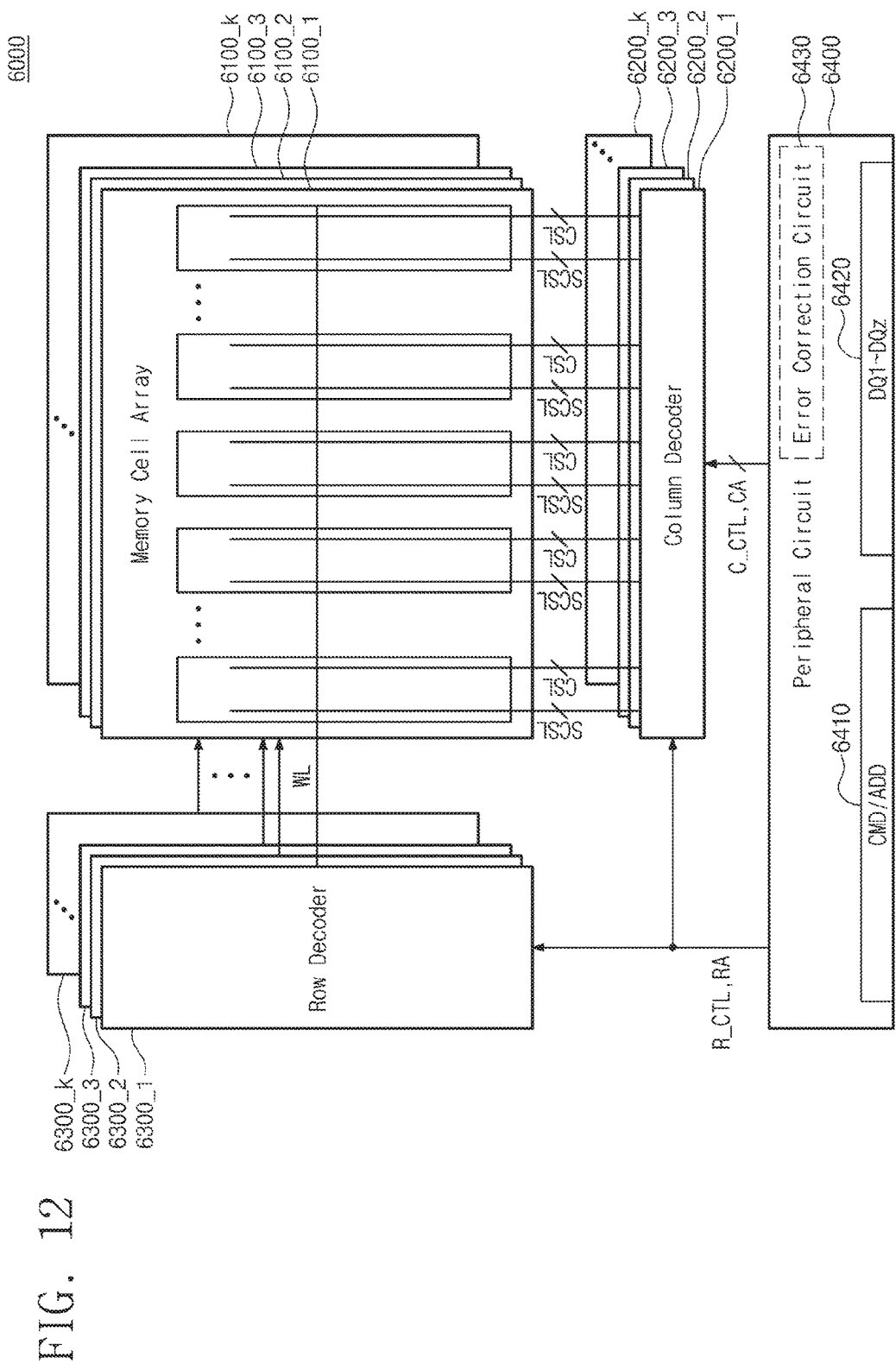
FIG. 12 illustrates a block diagram of a memory device, according to an embodiment of the inventive concept.

FIG. 12 illustrates a block diagram of a memory device, according to an embodiment of the inventive concept. Referring to FIG. 12, a memory device 6000 includes first to k-th memory cell arrays 6100_1, 6100_2, 6100_3 to 6100_k, first to k-th column decoders 6200_1, 6200_2, 6200_3 to 6200_k, first to k-th row decoders 6300_1, 6300_2, 6300_3 to 6300_k, and a peripheral circuit 6400. Functions of the first to k-th memory cell arrays 6100_1 to 6100_k, the first to k-th column decoders 6200_1 to 6200_k, and the first to k-th row decoders 6300_1 to 6300_k may be the same as the functions described with reference to FIGS. 1 to 10. Here, "k" may be determined by a protocol or specification. For example, "k" may mean the number of banks or may be a positive integer larger than the number of banks.

The first to k-th column decoders 6200_1 to 6200_k and the first to k-th row decoders 6300_1 to 6300_k may be needed to drive the first to k-th memory cell arrays 6100_1 to 6100_k, respectively. In detail, the first memory cell array 6100_1 may be driven by the first column decoder 6200_1 and the first row decoder 6300_1. The first column decoder 6200_1 may control the first memory cell array 6100_1 using a plurality of column select lines CSL and a plurality of spare column select lines SCSL. The first row decoder 6300_1 may control the first memory cell array 6100_1 using a plurality of word lines WL. The remaining second to k-th memory cell arrays 6100_2 to 6100_k may be controlled in the same manner as the first memory cell array 6100_1.

Each of the first to k-th memory cell arrays 6100_1 to 6100_k may be the same as the memory cell array 1100 illustrated in FIG. 1. In the first memory cell array 6100_1, a first plurality of memory cells (not illustrated, memory cells disposed at intersections of the word line WL and the column select lines CSL) may be selected by the plurality of column select lines CSL. As in the previous description, a second plurality of memory cells (not illustrated, memory cells disposed at intersections of the word line WL and the spare column select lines SCSL) may be selected by the plurality of spare column select lines SCSL.

In an embodiment of the inventive concept, the memory device 6000 may include a plurality of input/output pads (not illustrated) to increase a data bandwidth. To this end, the memory device 6000 may select (i.e., activate) a word line WL in each of at least two memory cell arrays in response to an activation command from the outside. Afterwards, the memory device 6000 may receive the read command or the write command from the outside and may select any column select line in each of selected memory cell arrays. As described with respect to FIG. 3, a plurality of bit lines connected with any column select line may be selected together. Memory cells that are selected (i.e., activated) in memory cell arrays selected according to the activation command and the read or write command may be referred to as target memory cells. As described above, data corresponding to a code word may be stored in the target memory cells.

In the case where there are defects in the target memory cells, the memory device 6000 may perform a repair operation on the target memory cells. To this end, in each of the selected memory cell arrays, the memory device 6000 may repair the target memory cells with memory cells connected with a spare column select line at the same time. A column repair operation performed in each of the selected memory cell arrays may be similar to a column repair operation described with reference to FIGS. 1 to 11. However, the above-described column repair operation may be independently performed in each of the selected memory cell arrays. That is, all target memory cells corresponding to a code word may be repaired, or some of the target memory cells may be repaired.

The peripheral circuit 6400 includes command and address pads (CMD/ADD) 6410, first to z-th input/output pads (DQ1 to DQz) 6420, and an error correction circuit 6430. The peripheral circuit 6400 in FIG. 12 may include more input/output pads than the peripheral circuit 1300 of FIG. 1 to improve a data bandwidth. In an embodiment, "z" may be 512, 1024, or 2048.

Figure 13:
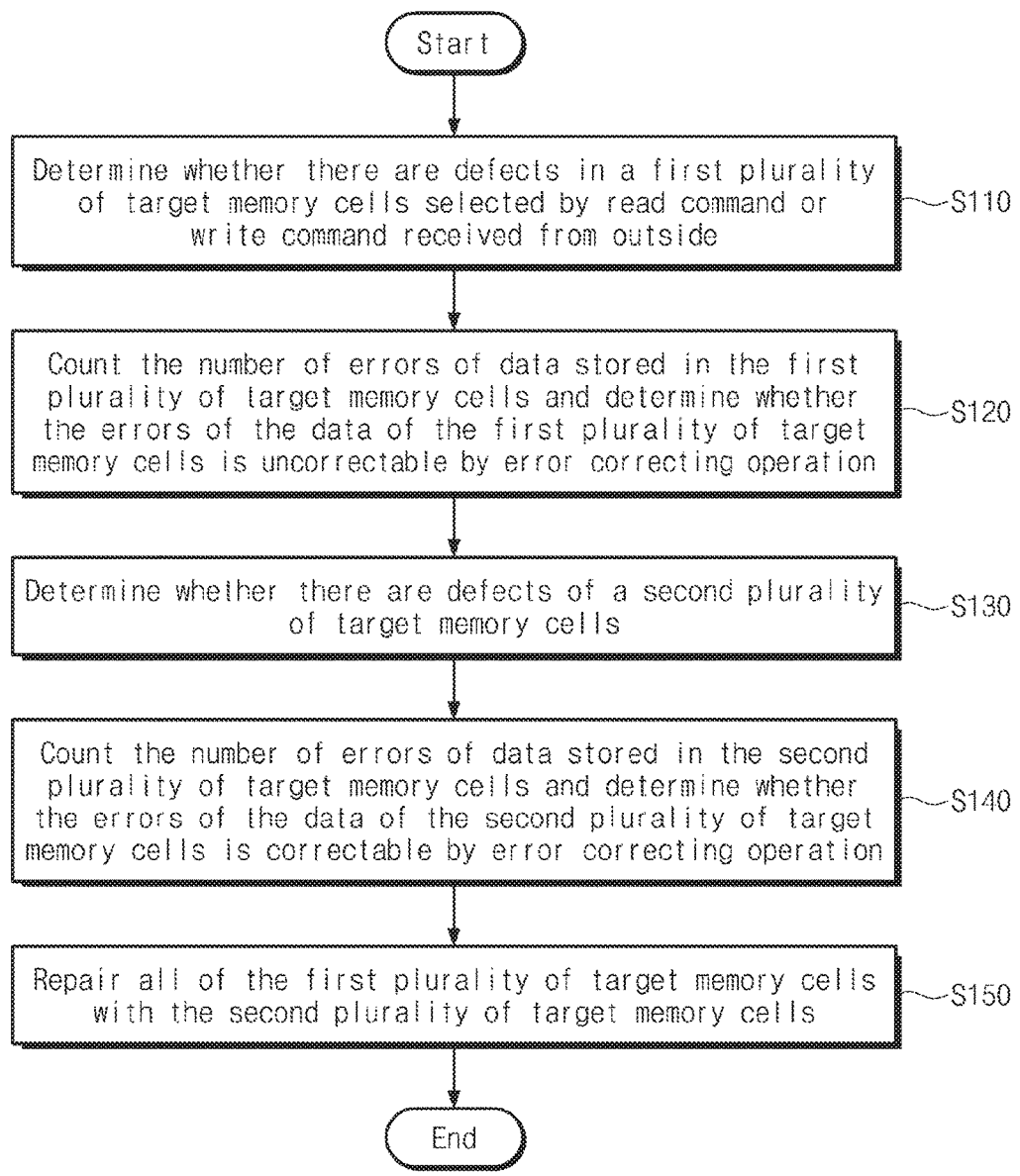
FIG. 13 illustrates a flowchart of a test method of the memory device, according to an embodiment of the inventive concept.

FIG. 13 illustrates a flowchart of a test method of a memory device, according to an embodiment of the inventive concept. FIG. 13 will be described with reference to FIGS. 4 and 5.

In operation S110, it is determined whether there are defects in a first plurality of target memory cells. As described previously, defects may be caused by damage to the hardware of the memory cell. As also described previously, data corresponding to a code word may be stored in the first plurality of target memory cells selected responsive to a write command from the outside, or data of the code word may be read from the first plurality of target memory cells selected responsive to a read command from the outside. The determination in operation S110 may be made based on tests performed during a wafer-level test step, for example. Unique characteristics of memory cells may be tested to test the first plurality of target memory cells. For example, in the case where a memory cell is a DRAM cell, tRCD (RAS to CAS Delay), tRP (Row Precharge Delay), tWR (Write Recover Delay), tREF (Refresh Period), or the like may be tested.

In operation S120, in the case where there are defects in the first plurality of target memory cells, it is determined whether an error of data stored in the first plurality of target memory cells is uncorrectable by error correction encoding and decoding. First, the number of errors in the data stored in the first plurality of target memory cells may be counted. Thereafter, based on the counted number of errors, it is determined whether the error in the data stored in the first plurality of target memory cells is correctable by the error correction encoding and decoding. The error correction encoding and decoding may be performed on the outside (e.g., a host or a memory controller) of the memory device or by an on-chip error correction circuit of the memory device (e.g., error correction circuit 1330 shown in FIG. 1). In accordance with operation S120, if the counted number of errors is too great, the error of the data stored in the first plurality of target memory cells may fail to be corrected through use of the spare memory cells or the error correction encoding and decoding. That is, if the counted number of errors is too great, even though some of the first plurality of target memory cells may be substituted with spare memory cells, the error of the data stored in the first plurality of target memory cells may still be uncorrectable by error correction data.

Upon determination in operation S120 that data stored in the first plurality of target memory cells is uncorrectable, it is determined in operation S130 whether there are defects in a second plurality of target memory cells. As described previously with respect to FIG. 5, the second plurality of target memory cells may be memory cells that are connected to a selected word line WL and the spare column select lines and that store the code word of the data through a of sub column decoders 3241 and 3257. Here, the number of the second plurality of target memory cells may be the same as the number of the first plurality of target memory cells. Like in operation S110, the determination in operation S130 may be based on tests performed in the wafer-level test step, for example. The above-described unique characteristics of memory cells (as described previously with respect to operation S110) of the second plurality of target memory cells may be tested.

In operation S140, in the case where there are defects in the second plurality of target memory cells, it is determined whether an error of data stored in the second plurality of target memory cells is correctable by the error correction encoding and decoding. First, the number of errors in the data stored in the second plurality of target memory cells may be counted. In the case where there are no defects in the second plurality of target memory cells, or in the case where an error in the data stored in the second plurality of target memory cells is correctable even though there are defects in the second plurality of target memory cells, the second plurality of target memory cells may be usable. Similar to operation S120, the error correction encoding and decoding in operation S140 may be performed on the outside (e.g., a host or a memory controller) of the memory device or by an on-chip error correction circuit of the memory device (e.g., error correction circuit 1330 shown in FIG. 1).

In operation S150, the first plurality of target memory cells may be substituted with the second plurality of target memory cells. That is, if the above-described error in the data stored in the second plurality of target memory cells is correctable by the error correction encoding and decoding even though an error occurs in data due to defects of the second plurality of target memory cells, the second plurality of target memory cells may be usable. Accordingly, a test method according to an embodiment of the inventive concept may enhance the yield of the memory device.

FIG. 14 illustrates a block diagram of an application example of a memory device, according to an embodiment of the inventive concept. Referring to FIG. 14, a computer system 7000 includes a host 7100, a user interface 7200, a storage module 7300, a network module 7400, a memory module 7500, and a system bus 7600.

The host 7100 may drive elements and an operating system of the computer system 7000. In an embodiment, the host 7100 may include controllers for controlling elements of the computer system 7000, interfaces, and graphics engines, among other components. The host 7100 may be a system-on-chip (SoC).

The user interface 7200 may include interfaces that input data or an instruction to the host 7100 or output data to an external device. In an embodiment, the user interface 7200 may include user input interfaces such as for example a keyboard, a keypad, buttons, a touch panel, a touch screen, a touch pad, a touch ball, a camera, a microphone, a gyroscope sensor, a vibration sensor, and a piezoelectric sensor, or the like. The user interface 7200 may further include interfaces such as for example a liquid crystal display (LCD), an organic light-emitting diode (OLED) display device, an active matrix OLED (AMOLED) display device, a light-emitting diode (LED), a speaker, and a motor, or the like.

The storage module 7300 may store data. For example, the storage module 7300 may store data received from the host 7100. Alternatively, the storage module 7300 may transfer data stored therein to the host 7100. In an embodiment of the inventive concept, the storage module 7300 may be implemented with a nonvolatile memory device such as for example an erasable programmable read only memory (EPROM), an electrically erasable programmable read only memory (EEPROM), a NAND flash memory, a NOR flash memory, a phase-change RAM (PRAM), a resistive RAM (ReRAM), a ferroelectric RAM (FeRAM), a magneto-resistive RAM (MRAM), or a thyristor RAM (TRAM), or the like. The storage module 7300 may be the memory device according to embodiments of the inventive concept.

The network module 7400 may communicate with external devices. In an embodiment, the network module 7400 may support wireless communications, such as for example code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless LAN (WLAN), ultra wide band (UWB), Bluetooth, and wireless display (WI-DI), or the like.

The memory module 7500 may operate as a main memory, a working memory, a buffer memory, or a cache memory of the computer system 7000. The memory module 7500 may include volatile memories such as for example a DRAM and an SRAM, or nonvolatile memories such as for example a NAND flash memory, a NOR flash memory, a PRAM, a ReRAM, a FeRAM, an MRAM, and a TRAM. The storage device 7500 may include at least one of the memory devices 1000, 2000, 3000, 4000, 5000, and 6000 according to embodiments of the inventive concept.

The system bus 7600 may electrically connect the host 7100, the user interface 7200, the storage module 7300, the network module 7400, and the memory module 7500 to each other.

A memory device according to embodiments of the inventive concept may improve repair efficiency by increasing a usable column redundancy.

While the inventive concept has been described with reference to the various embodiments, it should be apparent to those skilled in the art that various changes and modifications may be made without departing from the spirit and scope of the inventive concept. Therefore, it should be understood that the above embodiments are not limiting, but illustrative.

What is claimed is:

1. A memory device comprising:
   a memory cell array comprising a plurality of mats connected to a word line and a plurality of bit lines; and
   a column decoder comprising a first repair circuit in which a first repair column address is stored, and a second repair circuit in which a second repair column address is stored,
   wherein when the first repair column address coincides with a received column address in a read command or a write command, the column decoder is configured to select other bit lines from among the plurality of bit lines instead of bit lines from among the plurality of bit lines corresponding to the received column address in one mat among the plurality of mats, and
   wherein when the second repair column address coincides with the received column address, the column decoder is configured to select other bit lines from among the plurality of bit lines instead of the bit lines corresponding to the received column address in the plurality of mats.

2. The memory device of claim 1, wherein the memory cell array further comprises:
   a first plurality of memory cells connected to the word line and a first plurality of bit lines from among the plurality of bit lines; and
   a second plurality of memory cells connected to the word line and a second plurality of bit lines from among the plurality of bit lines,
   wherein the first plurality of memory cells and the second plurality of memory cells are disposed in each of the plurality of mats,
   wherein when the second repair column address does not coincide with the received column address, the column decoder is configured to select a first plurality of target memory cells from among the first plurality of memory cells, and
   wherein when the second repair column address coincides with the received column address, the column decoder is configured to select a second plurality of target memory cells from among the second plurality of memory cells.

3. The memory device of claim 2, wherein a number of defects in the second plurality of target memory cells is less than a number of defects in the first plurality of target memory cells, and
   wherein data stored in the first plurality of target memory cells are not correctable by error correction encoding and decoding, and data stored in the second plurality of target memory cells are correctable by the error correction encoding and decoding.

4. The memory device of claim 2, wherein a number of the first plurality of target memory cells and a number of the second plurality of target memory cells correspond in size to a sum of normal data and parity data for error correction encoding and decoding associated with the normal data.

5. The memory device of claim 4, further comprising an error correction code (ECC) circuit configured to perform the error correction encoding and decoding using the parity data.

6. The memory device of claim 1, wherein the column decoder further comprises:
   a plurality of sub column decoders respectively connected to the plurality of mats, the plurality of sub column decoders configured to select a first plurality of bit lines with reference to the received column address and to select a second plurality of bit lines with reference to a first repair enable signal provided by the first repair circuit or a second repair enable signal provided by the second repair circuit.

7. The memory device of claim 6, wherein the first repair circuit is configured to compare the first repair column address with the received column address, and provide the first repair enable signal to one of the plurality of sub column decoders, and
   wherein the second repair circuit is configured to compare the second repair column address with the received column address, and provide the second repair enable signal to the plurality of sub column decoders.

8. The memory device of claim 6, wherein each of the plurality of sub column decoders comprises:
   a first column select line decoder configured to select the first plurality of bit lines with reference to the received column address when the first repair enable signal and the second repair enable signal are not activated; and
   a second column select line decoder configured to select the second plurality of bit lines when one of the first repair enable signal and the second repair enable signal is activated.

9. The memory device of claim 6, wherein the first plurality of bit lines and the second plurality of bit lines are respectively divided into a plurality of segments based on row addresses for selecting the word line, and
   wherein the column decoder further comprises:
   a segment decoder configured to decode the row addresses, and to provide the first repair circuit and the second repair circuit with segment information including information of a row address corresponding to the word line.

10. The memory device of claim 9, wherein the first repair circuit comprises:
    a first plurality of fuse sets in which a first plurality of repair column addresses are stored, a number of the first plurality of repair column addresses is the same as a number of the plurality of segments; and
    a first compare circuit configured to generate the first repair enable signal by comparing the received column address with a first repair column address from among the first plurality of repair column addresses of a first fuse set from among the first plurality of fuse sets which is activated by the segment information,
    wherein the first repair circuit is configured to provide the first repair enable signal to one of the plurality of sub column decoders,
    wherein the second repair circuit comprises
    a second plurality of fuse sets in which a second plurality of repair column addresses are stored, a number of the second plurality of repair column addresses is the same as the number of the plurality of segments; and a second compare circuit configured to generate the second repair enable signal by comparing the received column address with a second repair column address from among the second plurality of repair column addresses of a second fuse set from among the second plurality of fuse sets which is activated by the segment information, and wherein the second repair circuit is configured to provide the second repair enable signal to the plurality of sub column decoders.

11. A memory device comprising:

a memory cell array comprising a first plurality of mats connected with a first word line and a second plurality of mats connected with a second word line, wherein the first and second plurality of mats are connected to a plurality of bit lines, and wherein a plurality of memory cells connected to the first word line and the second word line are selected by a single activation command; and a column decoder comprising a first repair circuit in which a first repair column address is stored, and a second repair circuit in which a second repair column address is stored, wherein when the first repair column address coincides with a received column address in a read command or a write command, the column decoder is configured to select first bit lines from among the plurality of bit lines different from bit lines from among the plurality of bit lines corresponding to the received column address in the first plurality of mats, and wherein when the second repair column address coincides with the received column address, the column decoder is configured to select second bit lines from among the plurality of bit lines different from the bit lines corresponding to the received column address in the second plurality of mats.

12. The memory device of claim 11, wherein a number of target memory cells selected by the column decoder from among the plurality of memory cells corresponds in size to a sum of normal data and parity data for error correction encoding and decoding associated with the normal data.

13. The memory device of claim 12, further comprising an error correction code (ECC) circuit configured to perform the error correction encoding and decoding using the parity data.

14. The memory device of claim 11, wherein the column decoder further comprises:

a third repair circuit in which a third column address is stored, wherein when the third column address coincides with the received column address, the column decoder is configured to select third bit lines from among the plurality of bit lines instead of the bit lines corresponding to the received column address in one mat from among the first plurality of mats and one mat from among the second plurality of mats.

15. The memory device of claim 11, wherein the first repair circuit generates a first repair enable signal when the received column address coincides with the first repair column address, wherein the second repair circuit generates a second repair enable signal when the received column address coincides with the second repair column address, and wherein the column decoder further comprises:

a plurality of sub column decoders respectively connected with the first plurality of mats and the second plurality of mats, the plurality of sub column decoders configured to select the bit lines corresponding to the received column address when the first and second repair enable signals are not activated, to select the first bit lines when the first repair enable signal is activated, and to select the second bit lines when the second repair enable signal is activated.

16. A memory device comprising:

a plurality of memory cell arrays; and a plurality of column decoders respectively connected with the plurality of memory cell arrays, each of the plurality of column decoders comprising a first repair circuit in which a first repair column address is stored and a second repair circuit in which a second repair column address is stored, wherein each of the plurality of memory cell arrays includes a plurality of mats connected to one word line, and a plurality of bit lines connected to the plurality of mats, wherein at least two memory cell arrays among the plurality of memory cell arrays are selected based on a single activation command, wherein when a received column address in a read command or a write command and the first repair column address coincide with each other, each of at least two column decoders from the plurality of column decoders connected with the selected at least two memory cell arrays selects first bit lines from among the plurality of bit lines instead of bit lines from among the plurality of bit lines corresponding to the received column address in one mat among the plurality of mats, and wherein when the received column address and the second repair column address coincide with each other, each of the at least two column decoders connected with the selected at least two memory cell arrays selects second bit lines from among the plurality of bit lines instead of the bit lines corresponding to the received column address in the plurality of mats.

17. The memory device of claim 16, wherein in the selected at least two memory cell arrays, a number of target memory cells selected by the at least two column decoders corresponds in size to a sum of normal data and parity data for error correction encoding and decoding associated with the normal data.

18. The memory device of claim 17, further comprising an error correction code (ECC) circuit configured to perform the error correction encoding and decoding using the parity data.

19. The memory device of claim 16, wherein each of the plurality of column decoders further comprises:

a plurality of sub column decoders configured to select the bit lines corresponding to the received column address, wherein a number of the plurality of sub column decoders is the same as a number of the plurality of mats, wherein in each of the plurality of column decoders, the first repair circuit provides a first repair enable signal to one of the plurality of sub column decoders when the received column address coincides with the first repair column address, and wherein in each of the plurality of column decoders, the second repair circuit provides a second repair enable signal to the plurality of sub column decoders when the received column address coincides with the second repair column address.

20. The memory device of claim 16, wherein the first repair column address is different from the second repair column address.

* * * * *